(12) United States Patent
Akimoto et al.

(10) Patent No.: US 6,359,688 B2
(45) Date of Patent: *Mar. 19, 2002

(54) PROJECTION EXPOSURE APPARATUS AND METHOD OF CONTROLLING SAME

(75) Inventors: Satoshi Akimoto, Utsunomiya; Shigeyuki Uzawa, Tokyo; Shinji Wakui, Utsunomiya, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,982

(22) Filed: Feb. 12, 1999

(30) Foreign Application Priority Data

Feb. 19, 1998 (JP) .............................. 10-052683
Jan. 12, 1999 (JP) .............................. 11-005739

(51) Int. Cl.[7] .............................................. G01B 11/26
(52) U.S. Cl. ........................ 356/401; 356/400; 250/548
(58) Field of Search ..................... 356/400, 40; 355/53, 355/55; 250/548

(56) References Cited

U.S. PATENT DOCUMENTS

| 5,155,523 A | | 10/1992 | Hara et al. ...................... 355/53 |
| 5,187,519 A | * | 2/1993 | Takabayashi et al. ......... 355/53 |
| 5,504,407 A | | 4/1996 | Wakui et al. ........... 318/568.17 |
| 5,511,930 A | | 4/1996 | Sato et al. ................... 414/676 |
| 5,539,497 A | * | 7/1996 | Nishi ........................... 355/53 |
| 5,653,317 A | | 8/1997 | Wakui ......................... 188/378 |
| 5,812,420 A | * | 9/1998 | Takahashi ................... 364/508 |
| 5,832,620 A | * | 11/1998 | Yamaguchi et al. .......... 33/568 |
| 5,909,272 A | * | 6/1999 | Osanai et al. ................. 355/53 |

FOREIGN PATENT DOCUMENTS

| JP | 60-32050 | * | 2/1985 |
| JP | 5-250041 | | 9/1993 |
| JP | 7-319549 | | 12/1995 |
| JP | 10-12513 | | 1/1998 |
| JP | 10-261580 | | 9/1998 |

* cited by examiner

Primary Examiner—F. L. Evans
Assistant Examiner—Zandra V. Smith
(74) Attorney, Agent, or Firm—Fitzpatrick, Cella, Harper & Scinto

(57) ABSTRACT

A projection exposure apparatus includes projection optics for projecting a pattern, which has been formed on a mask or reticle, onto a wafer placed on a stage; an XYZ stage on which the substrate is placed and which is movable along the direction of the optic axis of the projection optics and in a direction orthogonal to the direction of the optic axis; a surface position measurement unit capable of measuring a predetermined position along the optic axis of the projection optics and the relative position of the surface of the substrate on the state; and a vibration measurement unit capable of measuring vibration of the projection optics. The XYZ stage is driven and controlled based upon results of measurement from the surface position measurement unit and vibration measurement unit, thereby reducing deviation between the wafer surface and imaging plane and improving contrast and resolving power.

54 Claims, 11 Drawing Sheets

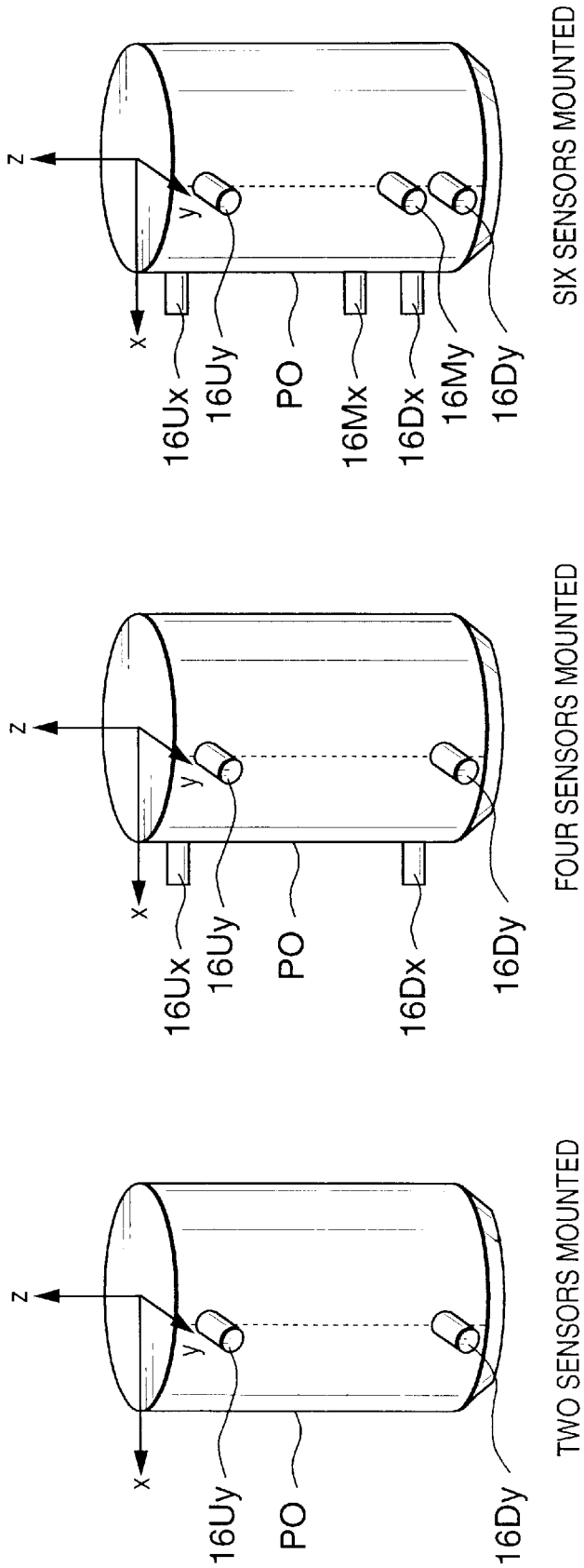

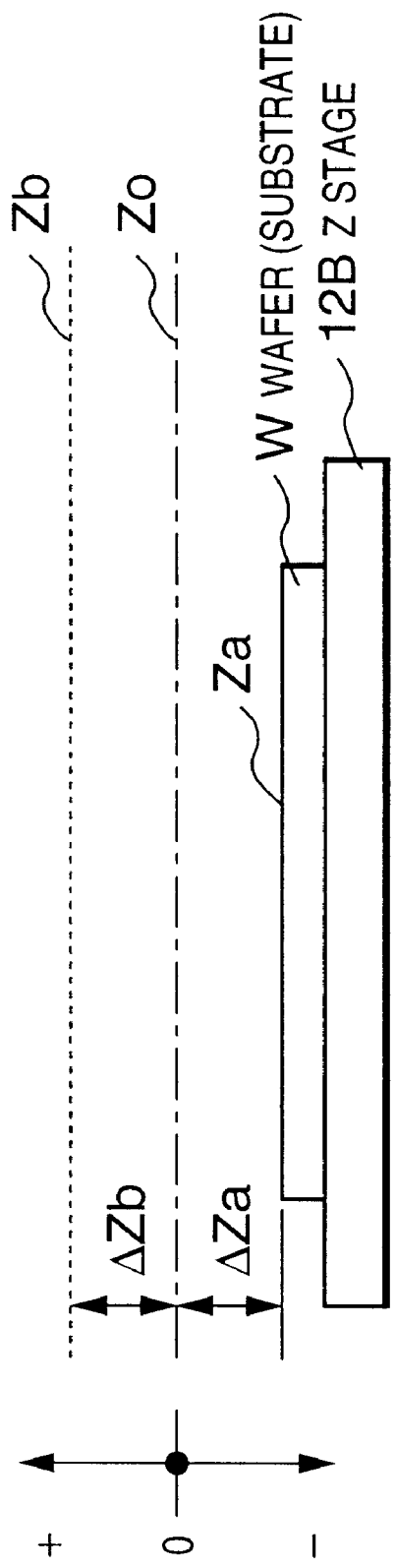

PROJECTION EXPOSURE APPARATUS AND METHOD OF CONTROLLING SAME

BACKGROUND OF THE INVENTION

This invention relates to a projection exposure apparatus used when manufacturing a semiconductor chip, a liquid crystal panel, a CCD, a thin-film magnetic head or a micromachine, etc., by means of photolithography. More particularly, the invention relates to a projection exposure apparatus having means for adjusting deviation between the substrate surface of a mask or the substrate surface of a semiconductor wafer or the like, which is for manufacturing a device such as a semiconductor device or liquid crystal device, and the imaging plane of a projection optical system. The invention further relates to a method of manufacturing a device.

When a semiconductor device or liquid crystal device is manufactured by photolithography, use is made of a semiconductor exposure apparatus to transfer a pattern, which is drawn on a reticle serving as a original plate, onto a wafer coated with a photosensitive material.

A so-called step-and-repeat demagnifying-projection-type semiconductor exposure apparatus is employed at many production facilities as the semiconductor exposure apparatus according to the prior art. Such an apparatus moves each of a plurality of exposure areas (shot areas) of a wafer into the exposure field of the projection optics in successive fashion and exposes each of the shot areas to a reticle circuit pattern in one batch. However, enlarging the size of semiconductor chips has become the trend in recent years and, as a result, there is a growing demand for a larger exposure surface area in a semiconductor exposure apparatus in order that a pattern of a larger area on a reticle may be transferred to a wafer. At the same time, there is a need to improve the resolving power in order to deal with finer patters on semiconductor devices. A problem with the prior art, however, is that it is difficult technically to design and manufacture a demagnifying-projection-type semiconductor exposure apparatus that satisfies both the requirements of improved resolving power and larger exposure area.

In order to solve this problem, a scanning-type projection exposure apparatus has been developed. This apparatus successively exposes a wafer to a pattern image, which has been drawn on a reticle, by scanning the reticle with respect to a slit-shaped illumination area and scanning the wafer at the same time as the reticle with respect to an exposure area serving also as the illumination area. In the scanning-type projection exposure apparatus, a reticle stage holding the reticle and a wafer stage holding the wafer, which is a photosensitive substrate, are synchronously scanned relative to the projection optics in a mutually opposing direction and at a velocity ratio that conforms to the projection magnification, thereby exposing the wafer to light.

In order to improve the throughput in both types of semiconductor exposure apparatus, the reticle stage and wafer stage must be driven at a high acceleration and high speed. Accordingly, it has not been possible to avoid vibration of structural members including a lens barrel (referred to as the projection optical system or projection optics below), which accommodates a group of projection lenses. Unfortunately, such vibration lengthens the time needed for stabilization of positioning or scanning and degrades exposure performance.

First, it is noteworthy that vibration of structural members brought about by a driving reaction force disturbs positioning stabilization of the reticle or wafer. The reason for this is that a laser interferometer serving as position measurement means for measuring the position of the reticle or wafer stage is mounted on a structural member. More specifically, since the position measurement means vibrates owing to vibration of the structural member, each stage also vibrates, as a result of which it takes longer for positioning to stabilize. Accordingly, positioning stabilization is facilitated by feeding back, to the inputs of the respective stage drivers, outputs from acceleration sensors provided on structural members in close proximity to the stages. This technique is already known and is disclosed in detail in the specification of Japanese Patent Application Laid-Open (KOKAI) No. 10-12513 entitled "Scanning-type Projection Exposure Apparatus". This control technique ascertains the vibration of a surface plate caused by stage vibration and moves the stage while following up this vibration, thereby eliminating positioning error.

Described next will be degradation of exposure performance caused by vibration due to the driving reaction force.

First, vibration due to the driving reaction force causes vibration not only of structural members such as the surface plate directly supporting the stage itself but also of the projection optical system, which is the heart of the projection apparatus. The mode of vibration of the projection optical system naturally is different from that of a structural member such as the surface plate directly supporting the stage. The projection optical system, which is a generally columnar structural member, usually is disposed in a vertical attitude and is mechanically connected to a structural member of the main body at a connecting portion referred to as a flange. Accordingly, a lower order mode of vibration that has a great effect upon exposure performance is one that would cause the columnar projection optical system to wobble. For example, in a case where a semiconductor exposure apparatus is of the scanning type, it is important that the wafer be exposed to a quiescent reticle circuit pattern by synchronously scanning the reticle and wafer at a predetermined velocity ratio. If the projection optical system is vibrating at this time, the circuit pattern also will vibrate on the wafer and, hence, projection precision will decline.

The effects of vibration of the projection optics, which is caused by stage vibration, on exposure precision will now be described with reference to the drawings.

FIG. 1 illustrates a scanning-type semiconductor projection apparatus, which is one embodiment of the present invention. As shown in FIG. 1, illuminating light IL emitted by a light source 1 is acted upon by a mirror 2, a reticle blind 3, a relay lens 4, a mirror 5 and a condenser lens 3 and illuminates a reticle 7 with a uniform illuminance and over a slit-shaped illumination area decided by the reticle blind 3. A reticle stage 8 is supported on a reticle stage surface plate 9, and a reticle interferometer 11 is provided for sensing the position of the reticle stage 8 by projecting a laser beam LB onto a moving mirror 10 on the reticle stage 8 and then receiving the reflected light. The reticle stage 8 is staged to the left and right (along the direction of the y axis) in FIG. 1.

A projection optical system PO is disposed below the reticle stage 8 and projects, in a reduced size, the circuit pattern of reticle 7 onto a wafer W, which is a photosensitive substrate, at a predetermined demagnification. The wafer W is held by a precision stage 12a on the top of a wafer stage 12 moved two-dimensionally in a horizontal plane. The position of the wafer stage 12 can be sensed by using a wafer laser interferometer 14, which irradiates a moving mirror 13 with a laser beam LB and receives the reflected light. The wafer stage 12 is mounted on the wafer stage surface plate 15.

During an exposure operation, the wafer stage 12 is scanned in sync with the reticle stage 8 in a direction opposite that of the reticle stage 8 along the y axis in FIG. 1. Reaction forces produced by driving both stages cause vibration of the structural members of the main body, which include the reticle stage surface plate 9 and wafer stage surface plate 15. This causes vibration also of the projection optical system PO, which is one of the structural members of the main body.

The influence of vibration-induced error that develops in the measurement signals from the reticle interferometer 11 and wafer laser interferometer 14 can be ascertained by feeding back, to the control systems of respective stages, the outputs of acceleration sensors 18R and 18W serving as vibration sensors provided in close proximity to the stages. The feedback arrangement is disclosed in the specification of Japanese Patent Application Laid-Open No. 10-12513 entitled "Scanning-type Projection Exposure Apparatus". The vibration sustained by the projection optical system PO is of a mode different from that of vibration of the main body imposed upon the reticle interferometer 11 and wafer laser interferometer 14. The effects of vibration caused by the projection optical system PO upon exposure precision, therefore, cannot be mitigated or eliminated by the technique described in the above-mentioned laid-open specification.

The specification of Japanese Patent Application Laid-Open No. 10-261580 entitled "Projection Apparatus" also is publicly known material indicating an arrangement for solving the above-mentioned problem. This publication discloses an apparatus in which vibration of the main body of the exposure apparatus is measured by a vibration sensor, and a vibration-induced error that develops in the measured value from a laser interferometer is corrected for by a main control system using the result of measurement, whereby positional offset of the reticle and wafer is prevented. More specifically, vibration of the main body of the exposure apparatus is sensed by mounting a vibration sensor on the projection optical system, which accommodates a group of projection lenses, and feeding this vibration forward to a position control system that controls the position of a precision stage carrying a reticle.

Though this disclosure does not have any description specifying the position at which the vibration sensor is mounted, the drawings show that the vibration sensor is mounted below a lens barrel. In other words, the intention is to sense vibration at the position of exposure, namely on the side of the wafer. It will be appreciated that an attempt is being made to correct, at the reticle precision stage, the positioning precision whereof declines in proportion to the demagnification of the projection optical system PO, error at the exposure position caused by vibration of the lens barrel.

In FIG. 2 of the above-mentioned disclosure, there is shown a block for correcting the position of the reticle precision stage based upon an output signal from the vibration sensor with which the projection optical system is equipped. FIG. 8 of the present application shows FIG. 2 of the above-mentioned disclosure. The intended operation of the apparatus of FIG. 8 will now be described in detail using nomenclature and reference characters identical with those of the above-mentioned disclosure.

First, the output of an acceleration sensor 50 is converted to a velocity signal by an integrating circuit 70 and the velocity signal is then fed forward to a control system 56 for the reticle precision stage. The feed-forward signal is applied to a physical location (the input side of an integrator 76 in the Figure) representing the velocity of the reticle precision stage. In actuality, the signal can be injected only in front of the driver that drives the reticle precision stage. Accordingly, the depiction of the block diagram in FIG. 8 is in error and a faithful representation of this block diagram is not possible. However, an idea of what is striving to be achieved may be understood from FIG. 8. Specifically, vibration of the projection optical system is sensed by the acceleration sensor 50, absolute displacement of vibration of the projection optical system is calculated by directing the signal indicative of sensed vibration through the integrators 70 and 76, and the absolute displacement is deemed to correspond to a target signal applied to the reticle precision stage in the position control system. That is, a quantity corresponding to displacement caused by vibration of the projection optical system is calculated and the position of the reticle precision stage is corrected using this quantity per se.

Though it is described that the output of the acceleration sensor 50 is "fed forward" to the reticle precision stage, the output is "fed back" if a strict interpretation is made based upon the dynamics. The reason for this can be understood by referring to the specification of Japanese Patent Application Laid-Open No. 5-250041 entitled "Positioning Apparatus with Multiple Acceleration Feedback". Stated simply in strict conformity with the aforesaid Japanese Patent Application Laid-Open No. 10-261580, the projection optical system, which is a structural member, vibrates owing to the vibration of each stage. Conversely, when a structural member vibrates for some reason, this influences the performance of the stages. In other words, the structural members, which include the stages and projection optical system, are linked dynamically. If vibration (a signal indicative of acceleration) of these linked structural members is incorporated in the stage control systems, this can be thought of as feedback that contributes to the stability of the control systems. However, since the position of the reticle precision stage is corrected by this feedback, there is always a proper amount thereof and this amount is very small. As a result, this simply does not demonstrate an operation that will change the values specific to the stage control systems. For these reasons, the introduction of an output from a vibration sensor mounted on the projection optical system to a stage control system shall be referred to as feedback in the specification of this application.

Problems encountered with the arrangement of the apparatus disclosed in the above-mentioned Japanese Patent Application Laid-Open No. 10-261580 ("Exposure Apparatus") will now be indicated.

When the generally columnar projection optical system PO rotates about a center of rotation, both translational and rotational displacements are sustained by the group of lenses within the projection optical system. When a certain "center of rotation" is a "nodal point" on the projection optical system PO, shifts in the exposing light caused by translation and rotation experienced by the group of lenses cancel each other out and do not appear as a shift in the final imaging position on the wafer. In other words, though aberration occurs, correction for displacement of the exposure position is intrinsically unnecessary. Nevertheless, in accordance with the exposure apparatus of Japanese Patent Application Laid-Open No. 10-261580, the position of the reticle precision stage is corrected at all times using the output of the vibration sensor, which is mounted below the projection optical system, even though the projection optical system undergoes rotational vibration at a nodal point. Consequently, an error in the position of the exposing light is brought about by applying a meaningless correction where none is originally required. Japanese Patent Application Laid-Open No. 10-261580, in order to correct for the influence of vibration impressed upon the laser interferometer serving as the means for measuring the position of the stage, aims at measuring the vibration of the projection optical system, which is regarded as vibrating together with the laser interferometer, and applying a correction to the position of the reticle precision stage using a signal output indicative of the measured vibration. A problem which arises is that it is not possible to correct for the influence on exposing light error of vibration of the projection optical system, the aspect whereof is different from that of the laser interferometer.

The problems dealt with in the present invention will now be summarized.

Higher throughput sought when manufacturing semiconductor devices requires the high-speed scanning or high-speed positioning of the reticle stage and wafer stage. Owing to a reaction force produced when driving each stage in such a manufacturing operation, laser interferometers serving as means for measuring the positions of the respective stages rigidly connected to the structure of the main body of the apparatus are caused to vibrate. At the same time, vibration, the aspect of which is different from that of the aforementioned laser interferometers, also occurs in the projection optical system constituting the heart of the semiconductor exposure apparatus.

In the prior art, the effects on stage stabilization of vibration impressed upon the laser interferometers are mitigated or eliminated by control means which corrects for these effects. However, the projection optical system, which comprises a group of projection lens and a lens barrel accommodating these lenses, is generally columnar in shape and is supported mechanically in a vertical attitude. Driving the reticle stage or wafer stage, therefore, causes the projection optical system to undergo primarily wobbling vibration. Since this vibration bends the exposure light beam that passes through the interior of the projection optical system, it leads to poor exposure precision. In other words, an unsolved problem is that means have not yet been fully developed to eliminate the deleterious influence on exposure precision of vibration of the projection optical system the mode of which differs from the mode of vibration of the laser interferometer.

The foregoing is a consideration of the influence of projection optical system vibration upon positional offset of the reticle (original plate) and wafer (substrate to be exposed) in directions lying in a plane (the XY plane) orthogonal to the optic axis of the projection optical system. However, vibration of the projection optical system influences also offset (focal-point deviation) of the wafer in a direction along the optic axis of the projection optical system as well as distortion (aberration) of the image plane.

Thus, in the exposure apparatus according to the prior art, the surface of a wafer, for example, is brought into alignment with the imaging plane of a projection optical system. In order to do this, a focusing deviation or deviation in inclination at the surface of the wafer is measured by a focus inclination sensor and alignment is carried out using a stage that is capable of adjusting for this focusing deviation or deviation in inclination.

However, in such an exposure apparatus according to the prior art, the imaging plane and the wafer surface cannot be aligned with a high precision even if the stage is driven in accordance with a correction quantity calculated from the value measured by the focus inclination sensor. As a result, there is a decline in contrast, resolving power and alignment precision.

The reasons for this are believed to be as follows: Conventionally, the position of the focus inclination sensor relative to the imaging plane of the projection optical system is regarded as being fixed without measuring displacement or distortion of the imaging plane of the projection optical system. The amount by which the stage is to be corrected is calculated from the measured value provided by the focus inclination sensor, and the imaging plane and wafer surface are positioned accordingly. In actuality, however, the imaging plane is displaced or deformed by vibration of the projection optical system. Consequently, even if the stage is driven in accordance with the amount of correction calculated from the value measured by the focus inclination sensor, the displaced and/or distorted imaging plane cannot be brought into accurate alignment with the wafer surface. This leads to deteriorated contrast, resolving power and alignment precision.

SUMMARY OF THE INVENTION

Accordingly, an object of the present invention is to provide a projection exposure apparatus in which vibration of the projection optical system as caused by the driving reaction force of each of the stages does not have a deleterious effect upon exposure precision.

Another object of the present invention is to ascertain the state of vibration of the projection optical system in an appropriate fashion and correct for its effects upon exposure error.

Another object of the present invention is to provide a projection exposure apparatus in which the displacement of the imaging plane of the projection optical system is calculated by measuring vibration of the projection optical system and alignment of a substrate surface on a stage is carried out taking the calculated displacement of the imaging plane into account, thereby reducing deviation between the substrate surface and the imaging plane.

Yet another object of the present invention is to improve contrast and resolving power by reducing deviation between the substrate surface and the imaging plane.

A further object of the present invention is to provide a device manufacturing method using a projection exposure apparatus that attains the foregoing objects.

According to the present invention, the foregoing objects are attained by providing a projection exposure apparatus having a projection optical system for projecting a pattern, which has been formed on an original plate, onto a substrate to be exposed, the apparatus including at least two vibration measurement means for measuring vibration of the projection optical system.

According to a more specific first embodiment of the present invention, the projection exposure apparatus comprises an original plate stage on which the original plate is placed and which is movable in a plane orthogonal to the optic axis of the projection optical system; a substrate stage on which the substrate to be exposed is placed and which is movable in a plane orthogonal to the optic axis of the projection optical system; position measurement means for measuring positions of the original plate and substrate to be exposed; and control means for controlling the position of at least one of the original plate and substrate to be exposed based upon a measured value from the position measurement means and measured values from the at least two vibration measurement means.

In this embodiment, vibration sensors or laser interferometers of a number necessary to sense flexural vibration of the projection optical system are provided. In the case of a step-and-repeat exposure apparatus, preferably the control means applies the exposing light after sensing or judging that flexural vibration has fallen within a predetermined tolerance. In the case of a scanning-type projection exposure apparatus, preferably an approach distance ahead of the acceleration/deceleration profile or constant-velocity scan is optimized in order to drive the wafer or reticle or both in such a manner that flexural vibration of the projection optical system will fall within the predetermined tolerance when scanning exposure is performed.

Furthermore, in both the step-and-repeat demagnifying-projection-type semiconductor exposure apparatus and scanning-type projection exposure apparatus, it is preferred that the parameters of a vibration-proof device supporting the projection optical system be optimally selected so as to minimize flexural vibration in the projection optical system.

According to a more specific second embodiment of the present invention, the projection exposure apparatus comprises a substrate stage on which the substrate to be exposed is placed and which is movable along the direction of the optic axis of the projection optical system and in a direction orthogonal to the direction of the optic axis; surface position measurement means for measuring relative position of the surface of the substrate with respect to a predetermined position along the direction of the optic axis of the projection optical system; and control means for moving a prescribed amount and positioning the substrate along any direction orthogonal to the optic axis of the projection optical system using the substrate stage, and moving and positioning the substrate along the direction of the optic axis based upon measured values from the vibration measurement means and a measured value from the surface position measurement means, thereby aligning the surface of the substrate with the predetermined position. In this case, means can be provided for driving the original plate, on which the pattern has been formed, based upon the measured value from the vibration measurement means.

When the original plate stage and/or substrate stage is positioned in the conventional exposure apparatus, despite the fact that vibration of the projection optical system is sensed, only a single vibration sensor is used to sense this vibration, as described in the specification of Japanese Patent Application Laid-Open No. 10-261580, and a problem which arises is that it is not always possible to properly correct for a shift in imaging position in a direction orthogonal to the optic axis caused by vibration of the projection optical system, as mentioned above. By contrast, the present invention provides the exposure apparatus with at least two vibration measurement means so that modes of vibration of the projection optical system can be sensed separately. Accordingly, position and or travel of the original plate stage and/or substrate stage is corrected for in dependence upon the mode of vibration, thereby making it possible to improve precision of alignment of the substrate with respect to the original plate as well as the precision of synchronization of the original plate stage and substrate stage. As a result, the harmful effects of vibration of the projection optical system upon exposure precision can be suppressed.

In the conventional exposure apparatus described above, shift and distortion of the image plane due to vibration of the projection optical system at the time of automatic focusing is not taken into consideration. That is, vibration of the projection optical system is not sensed for the purpose of correcting automatic focusing. By contrast, the present invention is such that a plurality of acceleration sensors are mounted on the projection optical system. Displacement or distortion of the imaging plane of the projection optical system is calculated based upon measured values from these sensors, thereby making it possible to align the surface of the substrate with the imaging plane of the projection optical system in a highly precise fashion. As a result, contrast, resolving power and alignment precision can be improved.

In accordance with another embodiment of the present invention, the foregoing objects are attained by providing a projection exposure apparatus comprising: projection optics for projecting a pattern, which has been formed on an original plate, onto a substrate; a stage on which the substrate is placed and which is movable along the direction of an optic axis of the projection optics and in a direction orthogonal to the direction of the optic axis; surface position measurement means for measuring relative position of the surface of the substrate, which has been placed upon the stage, with respect to a predetermined position decided based upon the position of the projection optics; and vibration measurement means, which has a plurality of vibration sensors, for measuring vibration of the projection optics; and driving means for controlling drive of the stage based upon results of measurement by the surface position measurement means and the vibration measurement means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4A is a diagram showing ideal mounting locations for vibration sensors in a case where two vibration sensors are provided;

FIG. 4B is a diagram showing ideal mounting locations for vibration sensors in a case where four vibration sensors are provided;

FIG. 4C is a diagram showing ideal mounting locations for vibration sensors in a case where six vibration sensors are provided;

FIG. 11 is a diagram showing an example of the relationship among the position of a substrate surface, the reference position of an imaging plane and the actual position of the imaging plane.

DESCRIPTION OF THE PREFERRED EMBODIMENTS

Preferred embodiments of the present invention will now be described in detail in accordance with the accompanying drawings.

Figure 9:
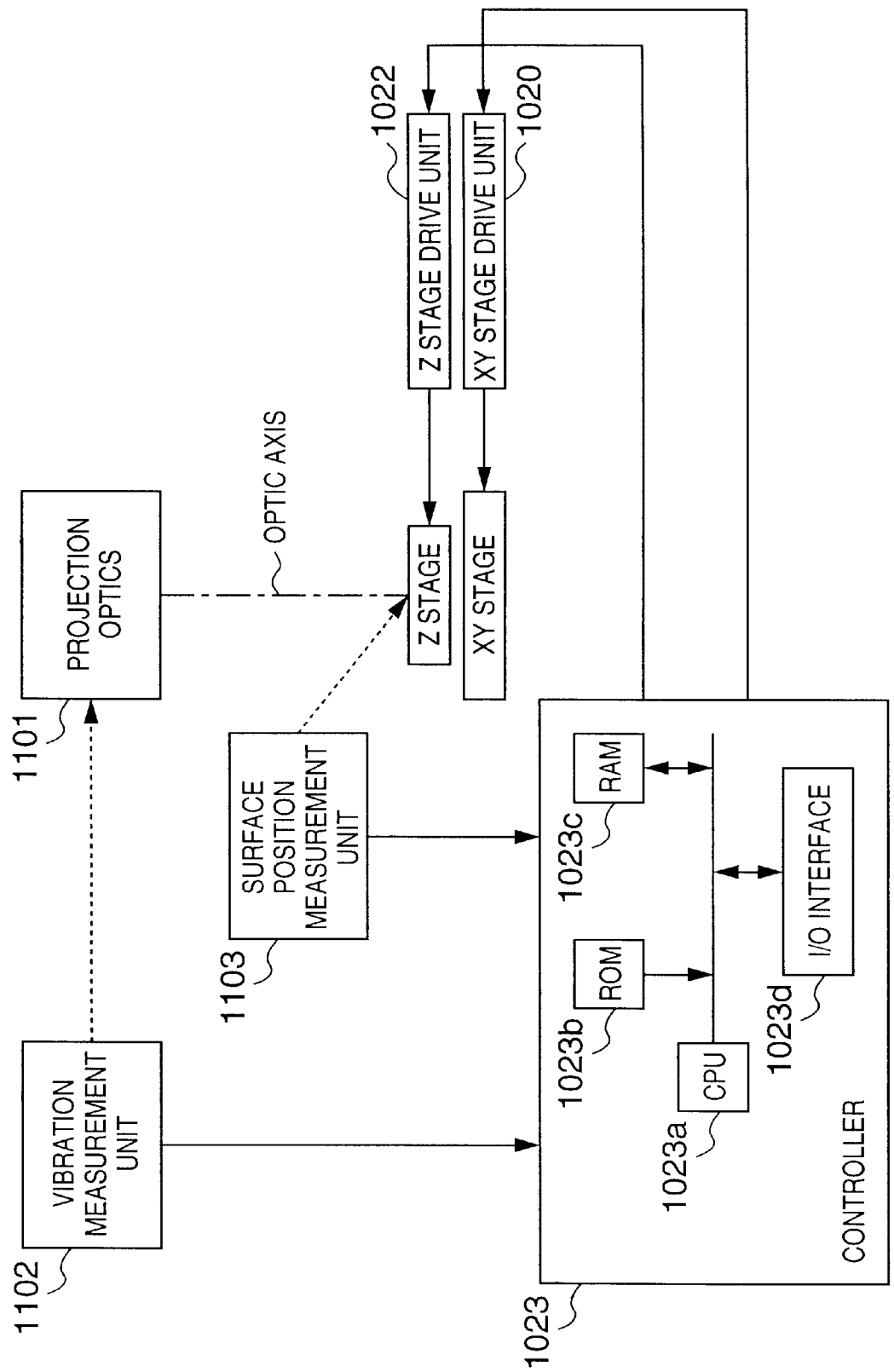
FIG. 9 is a diagram showing the principal control arrangement of this embodiment.

FIG. 9 is a diagram showing the principal control arrangement of this embodiment.

As shown in FIG. 9, a vibration measurement unit 1102 is capable of measuring the vibration of a projection optical system 1101 along one, two or three directions, namely the direction (Z direction) of the optic axis of the projection optical system and two orthogonal axial directions (X and Y directions) lying in a plane that is orthogonal to the optic axis. The vibration measurement unit 1102 has a plurality of vibration sensors, and it is preferred that these sensors be disposed, in a spaced-apart relation, on the projection optical system 1101 on the original plate side and the side of the substrate placed on the stage. In this case, it is particularly preferred that the sensors be disposed at end portions, or in the vicinity thereof, of the projection optical system 1101 on the original plate side and on the side of the substrate placed on the stage.

A surface position measurement unit 1103 measures the surface position of a substrate, which has been placed upon a Z stage, on the optic axis of the projection optical system 1101. On the basis of signals from the vibration measurement unit 1102 and surface position measurement unit 1103 representing the results of measurement, a controller 1023 controls the drive of the stage by an XY stage drive unit 1020 and Z stage drive unit 1022.

The controller 1023 has a CPU 1023a, a ROM 1023b, a RAM 1023c and an input/output (I/O) interface 1023d. The CPU 1023a implements control of the stage drive mentioned above by executing a control program that has been stored in the ROM 1023b. The RAM 1023c furnishes a working area used when various control operations are performed by the CPU 1023a. The I/O interface 1023d outputs signals from the controller 1023 to various drive units (1020, 1022) and inputs signals from various measurement units (1102, 1103) to the controller 1023.

By way of example, the controller 1023 detects vibration of the projection optical system 1101 based upon the output of the vibration measurement unit 1102. Examples of vibration capable of being detected are vibration of the primary mode (rigid-body mode) and vibration of secondary and tertiary modes (deformation modes).

Translational acceleration and rotational acceleration are examples of acceleration of vibration.

It is also possible to adopt an arrangement in which an original plate on which a pattern has been formed is driven based upon the measured value obtained from the vibration measurement unit 1102.

The vibration sensors of the vibration measurement unit 1102 are capable of measuring any of acceleration, velocity and displacement of the projection optical system 1101. Acceleration sensors, for example, can be used as these sensors.

It is possible to use laser interferometers instead of vibration sensors to measure vibration of the projection optical system.

Further, one method available for mounting the vibration measurement sensors is to mount them on the lens barrel of the projection optical system 1101. In this case, the controller 1023 would use the vibration measurement unit 1102 to calculate displacement of the imaging plane of projection optical system 1101 from vibration of the lens barrel and make the surface of the substrate on the stage coincide with the position of the imaging plane after the displacement thereof. Alternatively, the controller 1023 would use the vibration measurement unit 1102 to calculate the amount of distortion of the imaging plane from the vibration of the lens barrel and would correct the amount by which the stage is driven along the optic axis by the Z stage drive unit 1022.

Alternatively, acceleration of vibration, the mode of vibration or displacement of a predetermined position is calculated from vibration of the lens barrel using vibration sensors, and a correction may be applied at alignment of a substrate to be exposed or when an original plate stage and substrate stage are scanned.

The original plate on which the pattern is formed in the foregoing is a mask substrate or reticle substrate. The substrate placed on the stage may be any of a photosensitive substrate, a substrate for measuring an amount of deviation of a photosensitive substrate along the optic axis of the projection optical system 1101, a substrate for measuring an amount of deviation of a photosensitive substrate in a direction orthogonal to the optic axis of the projection optical system 1101, and a substrate for measuring the status of the projection exposure apparatus. Further, though the surface of the substrate is aligned with the surface of the imaging plane of projection optical system 1101 in the foregoing description, an arrangement may be adopted in which the substrate surface is aligned with a predetermined plane that is parallel to the imaging plane.

As set forth above, it is made possible to calculate displacement or deviation of the imaging plane of the projection optical system based upon the measured value of vibration experienced by the projection optical system. As a result, the surface of a substrate can be aligned with the imaging plane of the projection optical system in a highly precise fashion, and it is possible to improve contrast and alignment precision.

Embodiments of the present invention will now be described in greater detail with reference to the drawings.
(First Embodiment)

Figure 1:
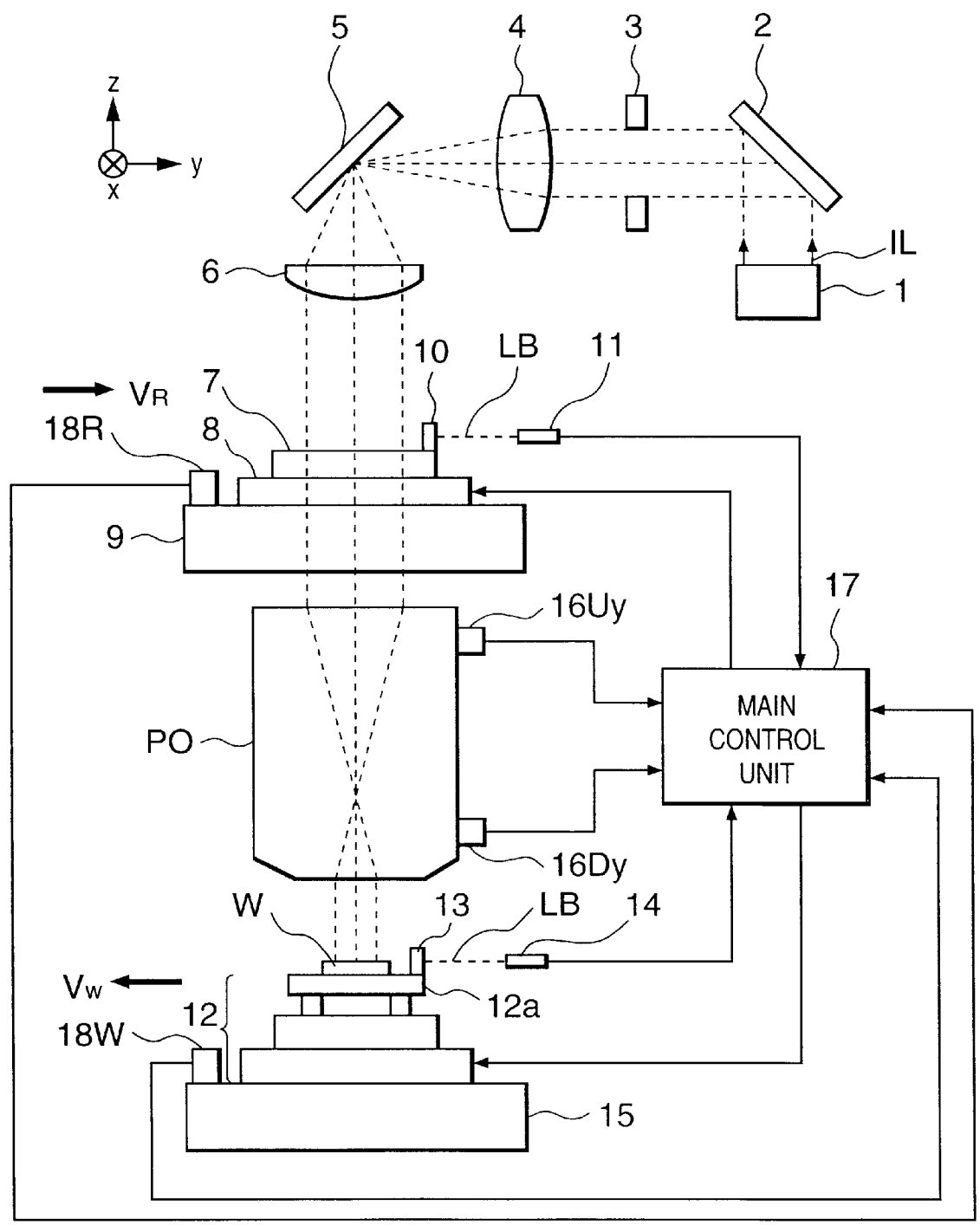
FIG. 1 is a diagram showing the construction of a semiconductor exposure apparatus according to a first embodiment of the present invention.

FIG. 1 is a diagram showing the construction of a semiconductor exposure apparatus according to an embodiment of the present invention. Since a description using this diagram has already been given in the background of the invention, only new components not discussed earlier will be described here.

Described first will be the operation performed by a main control unit 17 in a case where the semiconductor exposure apparatus is of the scanning type. The reticle stage 8 is scanned at a predetermined scanning velocity $V_R$ in the +y (or −y) direction based upon the output of the reticle interferometer 11. In sync with this operation, the wafer stage 12 is scanned at a velocity $V_W$, which is in accordance with a predetermined velocity ratio, in the −y (or +y) direction based upon the output of the wafer laser interferometer 14. It should be noted that the relation $V_W = \beta V_R$ holds, where β represents the demagnification of the projection optical system PO. Control of the reticle stage 8 based upon the output of the reticle interferometer 11 is performed independently of control of the wafer stage 12 based upon the output of the wafer laser interferometer 14. The synchronous relationship is upset by application of various external disturbances, and this invites synchronization error. A control loop for synchronous correction that maintains the relation $V_W = \beta V_R$ by eliminating this synchronization error also is included as a function in the main control unit 17. The loop structure of a master-slave synchronous control system disclosed in the specification of Japanese Patent Application Laid-Open No. 10-12513 is known as such means for restoring the synchronous relationship between the stages.

In contrast to the semiconductor exposure apparatus according to the prior art, the semiconductor exposure apparatus of this embodiment is characterized in that vibration sensors 16Uy, 16Dy are mounted on upper and lower portions, respectively, of the projection optical system PO, and the outputs of these sensors are input to the main control unit 17. More specifically, the state of vibration of the projection optical system PO is sensed by the vibration sensors 16Uy, 16Dy, and a correction is applied to synchronous scanning of the reticle stage 8 and wafer stage 12 based upon the outputs of these sensors to thereby eliminate the deleterious influence on exposure precision of vibration experienced by the projection optical system PO. Here, application of the correction to synchronous scanning means applying a correction to the reticle stage 8 or reticle stage surface plate 9 or to both stages. Acceleration sensors can be used ideally as the vibration sensors.

How a correction is applied to synchronous scanning of the reticle stage 8 and wafer stage 12 based upon the vibration sensors 16Uy and 16Dy mounted on the upper and lower portions of the projection optical system PO will be described in greater detail with reference to the drawings.

Note that, the units denoted by reference numerals 1–9 and PO correspond to the projection optical system 1101 shown in FIG. 9, the vibration sensors 16Uy and 16Dy correspond to the vibration measurement unit 1102, the wafer stage 12 corresponds to the XY and Z stage, and the main control unit 17 includes the XY stage drive unit 1020, the Z stage drive unit 1022 and the control unit 1023.

Figure 2:
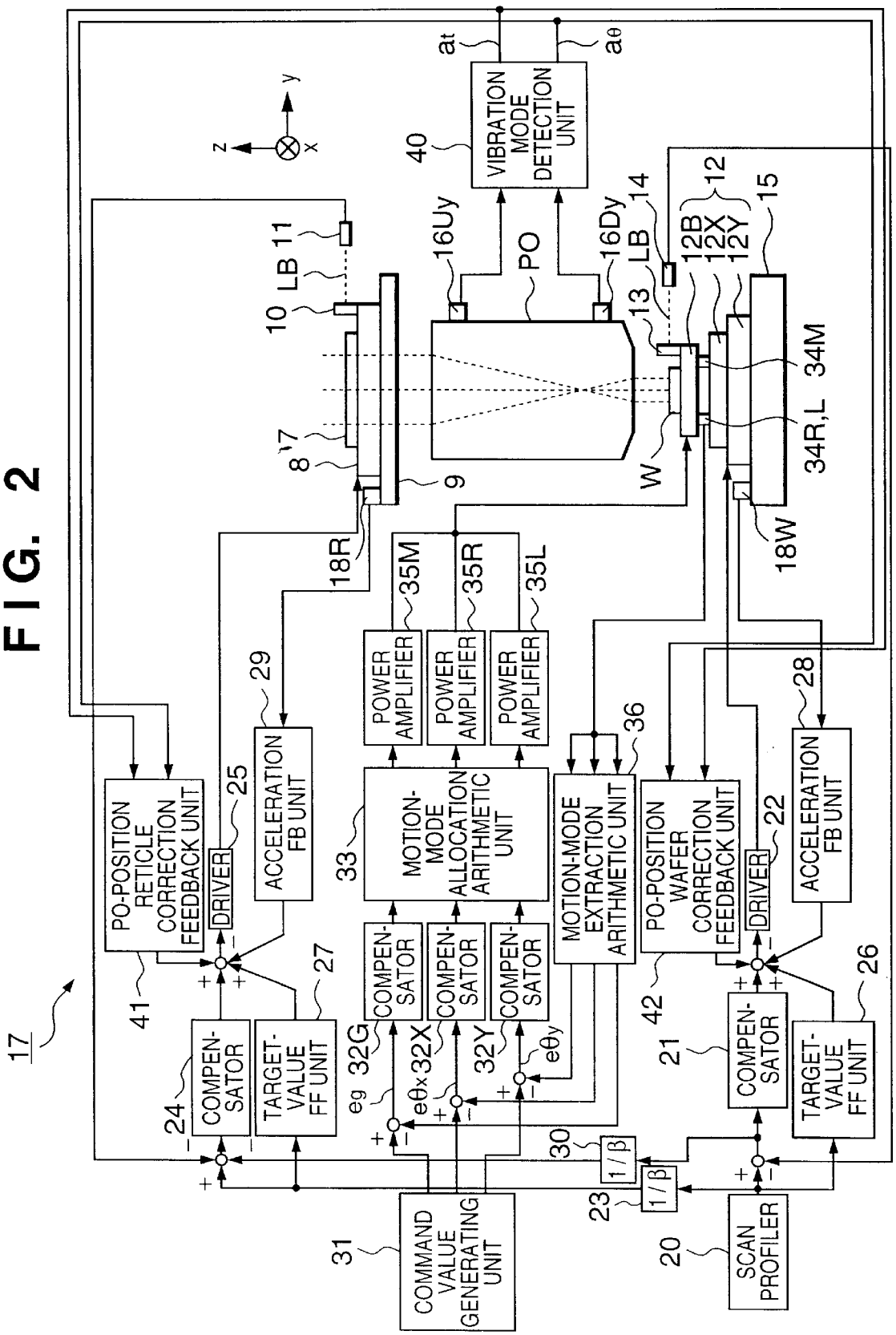
FIG. 2 is a diagram showing the details of construction of a main control unit according to this embodiment.

FIG. 2 shows a specific example of the construction of the main control unit 17 depicted in FIG. 1. The wafer stage 12 includes an X stage 12X driven along the X axis, a Y stage 12Y driven along the Y axis and a precision stage 12B. Described first will be a positioning control system for raising, lowering and tilting the precision stage 12B on which the wafer W is placed. Anon-interfering control system based upon the mode of motion is employed in regard to the precision stage 12B. The details are set forth in the specification of Japanese Patent Application Laid-Open No. 7-319549 of an application filed earlier by the present applicant. The system will be described here in brief. Numeral 36 denotes a motion-mode extraction arithmetic unit, to which a signal from a displacement detection unit (not shown) that measures the displacement of the precision stage 12B along the z axis is input, for extracting motion mode signals, namely signals indicative of z-axis translational motion, rotational motion about the x axis and rotational motion about the y axis. The outputs of this unit are compared with output signals from a command value generating unit 31 to generate motion-mode deviation signals (eg, $e\theta_x$, $e\theta_y$), where $\theta_g$ represents a motion-mode deviation signal representing z-axis translational motion, $e\theta_x$ a motion-mode deviation signal representing rotational motion about the x axis, and $e\theta_y$ a motion-mode deviation signal representing rotational motion about the y axis. These motion-mode deviation signals are applied to compensators 32G, 32X, 32Y, which are for applying optimum compensation for respective ones of the motion modes. The compensated signals are input to a motion-mode allocation unit 33, whose outputs are applied to power amplifiers 35M, 35R, 35L for operating actuators 34M, 34R, 34L that drive the precision stage 12B. The input to the command value generating unit 31 is a signal from a position measurement unit (not shown) for measuring focusing distance up to the exposed surface of the wafer W using the projection optical system PO as a reference. In Japanese Patent Application Laid-Open No. 7-319549, the actuators 34M, 34R, 34L are piezoelectric devices which include a displacement enlargement mechanism. In this embodiment, however, the invention is not limited to actuators of this kind, for the actuators can be of the electromagnetic type.

The position control unit for the wafer stage 12 scanningly driven along the y axis will be described next. First, a position deviation signal is obtained by comparing the output of the wafer laser interferometer 14 and the output of a scan profiler 20. The position deviation signal is applied to a suitable compensator 21, which proceeds to generate a drive signal. More specifically, a PID compensator can be used as the compensator 21, where P stands for a proportional operation, I for integration and D for differentiation. The drive signal generated by the compensator 21 is then applied to a driver 22 that drives the wafer stage 12, whereby the wafer stage 12 is oriented at a time and position specified by the scan profiler 20.

Lastly, there will be described a position control unit for the reticle stage 8 scanningly driven along the y axis. First, a deviation signal is obtained by comparing the output of the reticle interferometer 11 with a signal obtained by directing the output of the scan profiler 20 through a constant unit 23, in which the constant is the reciprocal $1/\beta$ of projection magnification $\beta$. This deviation signal is input to a compensator 24. A PID compensator similar to the compensator 21 already described is ideal as the compensator 24. The output of the latter is input to a driver 25, which drives the reticle stage 8.

Thus, drive of the wafer stage 12 and reticle stage 8 is controlled by closed loops based upon the outputs of the wafer laser interferometer 14 and reticle interferometer 11. Feed-forward compensation is applied in order to obtain a high-speed response in each closed loop. In regard to the wafer stage 12, the signal from the scan profiler 20 is fed forward to the input side of the driver 22 via a target-value feed-forward unit 26. As for the reticle stage 8, the signal from the constant unit 23 is fed forward to the input side of the driver 25 via a target-value feed-forward unit 27.

An error is impressed upon the measured value owing to vibration of the wafer laser interferometer 14 and reticle interferometer 11 caused by driving the stages. In order to cancel out this error, vibration of the wafer surface plate 15 is measured by vibration sensor 18W and the resulting signal is fed back to the input side of the driver 22 via an acceleration feedback unit 28. Similarly, vibration of the reticle surface plate 9 is measured by vibration sensor 18R and the resulting signal is fed back to the input side of the driver 25 via an acceleration feedback unit 29.

In order to synchronize the wafer stage 12 and reticle stage 8, a signal obtained by directing the position deviation signal of the closed loop for the wafer stage 12 through a synchronization correction path 30, which applies the reciprocal $1/\beta$ of demagnification $\beta$ of the projection optical system PO, is adopted as the target input of the closed loop for the reticle stage 8. A so-called master-slave synchronous control is employed.

By virtue of the control configuration described above, each stage can be oriented at a time and position specified by the scan profiler 20, and the stages can be scanned synchronously at a predetermined velocity ratio that satisfies the relation $V_W = \beta V_r$, where $V_W$ represents the velocity of the wafer stage 12 and $V_R$ the velocity of the reticle stage 8.

In addition, according to this embodiment, the vibration sensors 16Uy, 16Dy are provided on the upper and lower portions of the projection optical system PO and the signals from these sensors are exploited to assure exposure precision. First, the outputs of the vibration sensors 16Uy, 16Dy are applied to a vibration mode detection unit 40 of the projection optical system. The vibration mode detection unit 40 senses translational acceleration $a_\tau$ r and rotational acceleration $a_\theta$. Translational acceleration $a_\tau$ and rotational acceleration $a_\theta$, which relate to a nodal point of the projection optical system PO, may be calculated by a coordinate transformation using the position of the center of rotation based upon measurements by the vibration sensors 16Uy, 16Dy and the position of a nodal point already known from the standpoint of optical design. The necessity of separating vibration of the projection optical system PO into translational and rotational components will be discussed.

As mentioned earlier in the background of the invention, if the "center of rotation" of vibration and the "nodal point" of the projection optical system PO coincide and there is only a rotational vibration component about this point, exposure error ascribed to this component does not occur. Accordingly, corrections of both the reticle stage 8 and wafer stage 12 based upon the rotational vibration component are unnecessary. However, if the projection optical system PO has a translational vibration component in relation to the "nodal point", this will invite exposure error. It is necessary, therefore, to ascertain this component of vibration and apply a correction based upon the translational vibration component to the reticle stage 8 or wafer stage 12 or both. In general, there is a center of rotation of vibration at a point other than the nodal point, and translational vibration coexists with rotation about this point. Accordingly, it is necessary to apply a proper correction for both rotational and translational vibration.

When a parallel offset $\Delta\epsilon$ due to the translational vibration component of the projection optical system PO occurs, a position error $\Delta t\epsilon$ to be corrected can be expressed as follows: $\Delta t\epsilon = K\epsilon \Delta\epsilon$, where $K\epsilon$ is parallel offset sensitivity.

Similarly, when an oblique offset $\Delta\theta$ due to the rotational vibration component of the projection optical system PO occurs, a position error $\Delta t\theta$ to be corrected can be expressed as follows: $\Delta t\theta = K\theta \Delta\theta$, where $K\theta$ is oblique offset sensitivity. The position deviation that must be corrected in total is $\Delta t\epsilon + \Delta t\epsilon$. This quantity differs depending upon the mode of vibration of the projection optical system PO, namely upon how the translational and rotational vibration modes mix. More specifically, the absolute value differs depending upon the signs of the modes of vibration. Accordingly, providing at least two vibration sensors (16Uy, 16Dy) and sensing vibration of the projection optical system PO in a form separated into modes of vibration, as in the present embodiment, is highly significant.

With reference again to FIG. 2, the outputs $a_\tau$ and $a_\theta$ of the vibration mode detection unit 40 of projection optical system PO are both applied to a PO-position reticle correction feedback unit 41 and a PO-position wafer correction feedback unit 42. The feedback units 41 and 42 apply proper compensation based upon the input signals $a_\tau$ and $a_\theta$. The output of the feedback unit 41 is fed back to the input side of the driver 25, which drives the reticle stage 8, and the output of the feedback unit 42 is fed back to the input side of the driver 22, which drives the wafer stage 12.

Thus, the error inflicted upon exposure precision owing to vibration of the projection optical system PO can be corrected at the reticle stage 8 and wafer stage 12 jointly or at either stage singly.

Figure 3C:
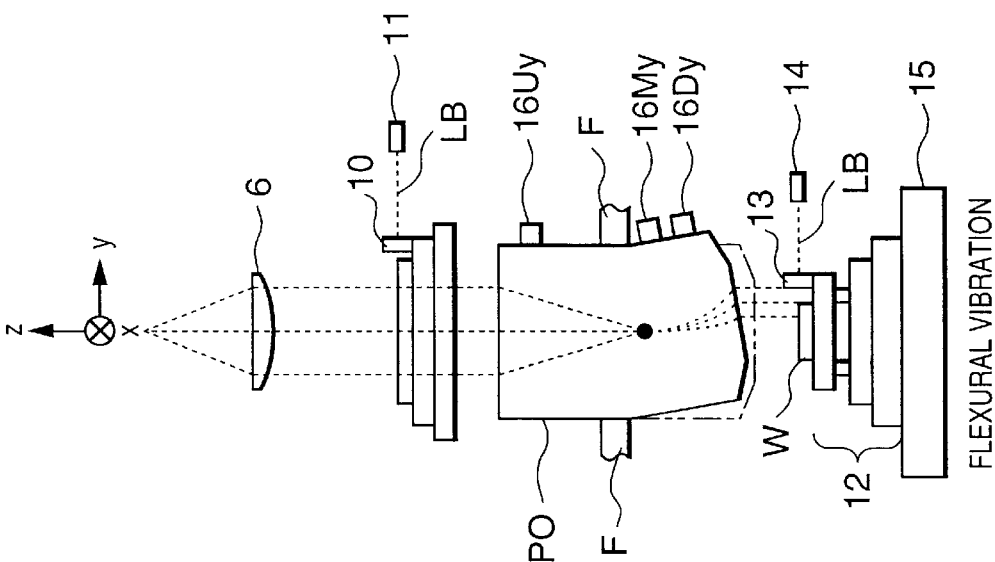
FIG. 3C is a diagram showing flexural vibration as a mode of vibration of the projection optical system.
Figure 3B:
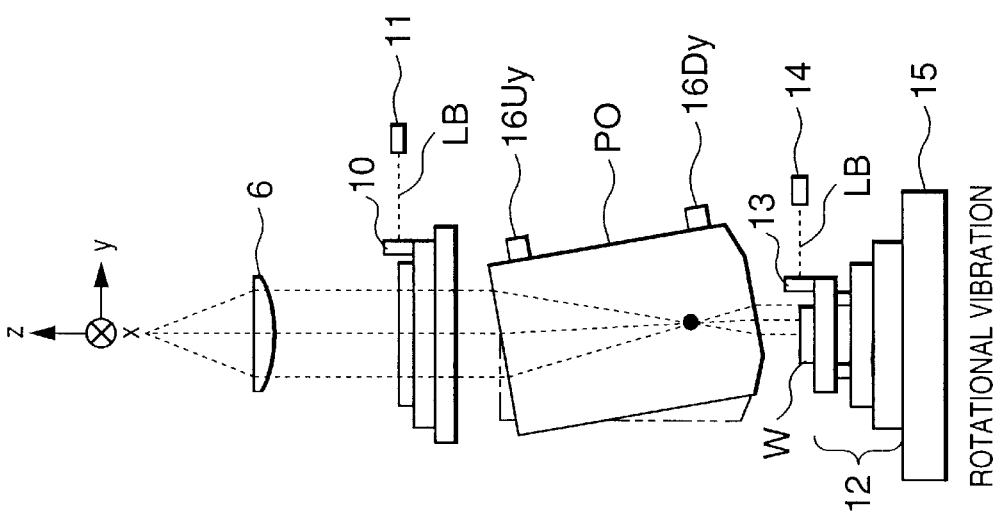
FIG. 3B is a diagram showing rotational vibration as a mode of vibration of the projection optical system.
Figure 3A:
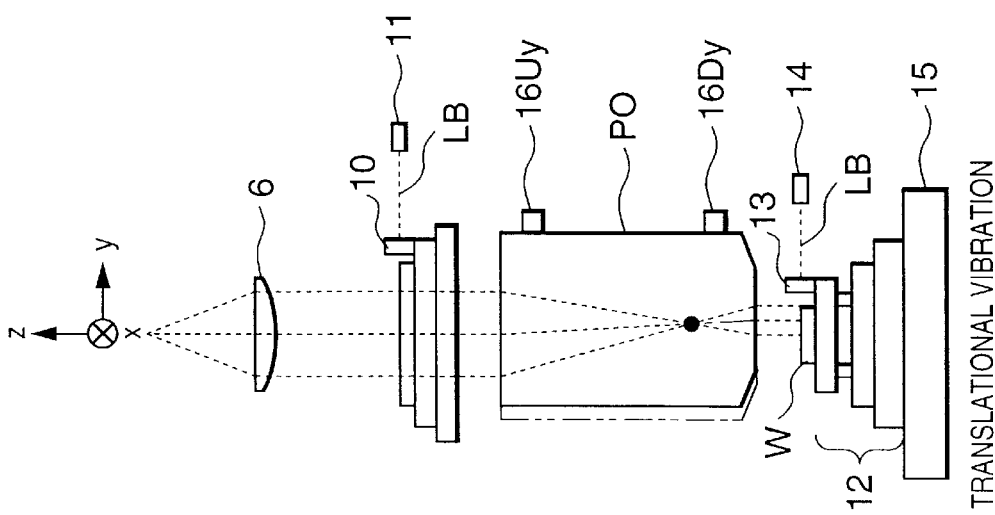
FIG. 3A is a diagram showing translational vibration as a mode of vibration of a projection optical system.

The path of the exposing light when the projection optical system PO vibrates is illustrated in FIGS. 3A to 3C in order to facilitate a better understanding of the embodiment. These diagrams illustrate the modes of vibration of the projection optical system PO. FIG. 3A illustrates the approximate path of the exposing light in a case where the projection optical system PO has undergone translation along the direction of the +y axis. The exposing light on the wafer W shifts in the +y direction in this case, as illustrated. FIG. 3B illustrates the approximate path of the exposing light in a case where the projection optical system PO has rotated about a center of rotation other than a nodal point. Here exposing light on the wafer W shifts in the +y direction if the rotation of the projection optical system PO is in the positive direction about the x axis. FIG. 3C illustrates the approximate path of the exposing light in a case where the projection optical system PO has undergone flexure. Flexure here means rotational deformation below a flange F supporting the projection optical system PO. Here, the exposing light on the wafer W is shifted as illustrated.

The exposing light on the wafer W thus shifts irrespective of the kind of vibration. However, the amount of shift to be corrected when the projection optical system PO undergoes translation and the amount of shift to be corrected when the projection optical system PO undergoes rotation about a certain center of rotation differ, as mentioned above. It is necessary, therefore, to provide the at least two vibration sensors 16Uy, 16Dy, which ascertain the vibration of the projection optical system PO, and correct for the amounts of shift by the arrangement of FIG. 2, for example, in regard to the respective modes of rotation. Of course, when the center of rotation is at the "nodal point" of the projection optical system PO in the case solely of vibration in the direction of rotation shown in FIG. 3B, no shift of the exposing light on the wafer W occurs and, hence, no correction is required, as set forth earlier.

In the case of FIG. 1 or FIG. 2, the vibration sensors 16Uy, 16Dy are disposed at the upper and lower portions of the projection optical system PO so as to be capable of sensing translation along the y axis and rotation about the x axis. The locations where these vibration sensors are mounted is illustrated in FIGS. 4A to 4C. FIG. 4A is a diagram in a case where the vibration sensors 16Uy, 16Dy have been mounted at locations similar to those shown in FIGS. 1 and 2. Of course, vibration sensors can be mounted so as to be capable of sensing translation along the x axis and rotation about the y axis as well. That is, as depicted in FIG. 4B, vibration sensors 16Ux, 16Dx may be mounted anew in addition to the vibration sensors 16Uy, 16Dy. Furthermore, an arrangement may be adopted in which a flexural vibration mode of the projection optical system PO can be sensed in addition to a rigid-body vibration mode, namely translation or rotation of the projection optical system PO. For example, if vibration sensors 16My, 16My are added, as shown in FIG. 4C, so as to be capable of sensing flexural vibration at the lower part of the projection optical system PO, the vibration shown in FIG. 3C can be sensed and the position of the reticle or wafer or the positions of both can be controlled using the measured values from these sensors.

In this embodiment, vibration sensors typified by acceleration sensors, for example, are provided as shown in FIGS. 4A, 4B and 4C in order to sense vibration of the projection optical system PO. However, instead of relying upon the vibration sensors 16, the projection optical system PO may be provided with at least two reference surfaces, for example, and these may be irradiated with laser beams from laser interferometers to thereby measure the vibration of the projection optical system PO. Naturally, the position of the reticle or wafer or the positions of both would be controlled, i.e., corrected, using the measured values of vibration of the projection optical system PO.

If flexural vibration of the kind depicted in FIG. 3C is present, the vibration can be sensed by providing the vibration sensors in the manner shown in FIG. 4C and a correction can be applied for the shift components on the wafer W based upon the measured values. Unfortunately, however, no correction can be made for aberration. In such, case, the method indicated below is adopted or the apparatus is suitably configured.

(1) In the case of a step-and-repeat demagnifying-projection-type semiconductor exposure apparatus, the exposing light is applied after sensing or judging that flexural vibration has fallen within a predetermined tolerance.

(2) In the case of a scanning projection exposure apparatus, an approach distance ahead of the acceleration/deceleration profile or constant-velocity scan of one or both of the wafer stage 12 and reticle stage 8 is optimized in such a manner that flexural vibration of the projection optical system will fall within the predetermined tolerance when scanning exposure is performed. In other words, the pattern of the scan profiler 20 in FIG. 2 is optimized.

(3) In both the step-and-repeat demagnifying-projection-type semiconductor exposure apparatus and scanning-type projection exposure apparatus, the parameters of a vibration-proof device (not shown) supporting the projection optical system PO are selected so as to minimize flexural vibration in the projection optical system. The cleverness of the parameter selection can manifest itself particularly in a case where the vibration-proof device is of the active type having an actuator and a sensor. Specifically, the operator may perform control such as changing over feedback parameters or feed-forward parameters of an active-type vibration-proof device at the time that a steady-state operation is performed so as to suppress flexural vibration.

This embodiment has a number of advantages, which will now be described.

(1) Higher throughput sought when manufacturing semiconductor devices requires the high-speed scanning or high-speed positioning of a reticle and wafer and, as a consequence, owing to reaction forces produced when driving the stages, the structural members of the semiconductor exposure apparatus are caused to vibrate. In particular, since the projection optical system constituting the heart of the semiconductor exposure apparatus is caused to vibrate, exposure performance is profoundly affected. In accordance with this embodiment, however, vibration sensors are mounted so as to readily sense the modes of vibration of the projection optical system that occur owing to the peculiar shape of the projection optical system, i.e., its generally columnar configuration. Scanning or positioning of the reticle stage and wafer stage can be controlled based upon the outputs of these sensors.

(2) Accordingly, stable, highly precise exposure can be carried out even if the projection optical system vibrates owing to driving reaction forces that arise for high-speed scanning or high-speed positioning.

(3) In addition, according to this embodiment, the structural members of the semiconductor exposure apparatus inclusive of the projection optical system need no longer be produced with excessive rigidity. This makes it possible to suppress costs that rise in dependence upon increases in precision and throughput demanded of semiconductor exposure systems.

(4) Thus, the embodiment contributes to improved quality and productivity of semiconductor devices produced by the semiconductor exposure apparatus.

(Second Embodiment)

Figure 5:
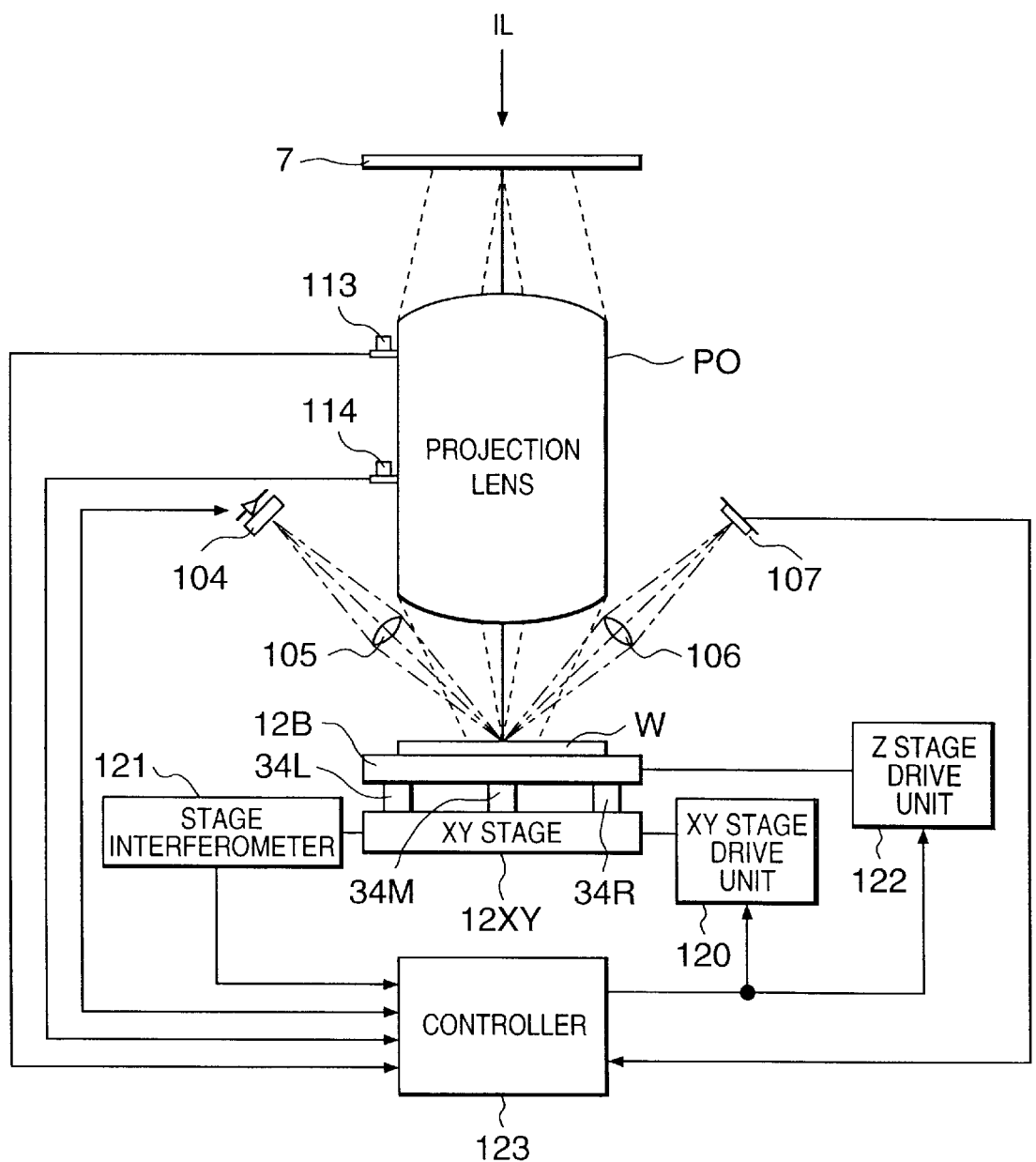
FIG. 5 is a diagram showing the construction of a projection exposure apparatus according to a second embodiment.

FIG. 5 illustrates the details of construction of a step-and-repeat projection exposure apparatus according to this embodiment. The reticle 7 having a circuit pattern is illuminated by illuminating light IL having a uniform illuminance. The pattern on the reticle 7 has its image formed by projection on the wafer W, which is for fabricating semiconductor device, by the a projection lens PO. The wafer W is placed on a Z stage 12B, which is subjected to Z-axis drive and leveling drive. The stage 12B is driven by drive systems 34M, 34R, 34L. The Z stage 12B and drive systems 34M, 34R, 34L are provided on an XY stage 12XY, which is translated two-dimensionally in a horizontal plane. The XY stage 12XY is driven by an XY stage drive unit 120, which includes a motor, and the position of this stage in terms of its coordinates is measured in successive fashion by a stage interferometer 121. By driving the drive systems 34M, 34R, 34L up and down (i.e., by operating them along the optic axis of the projection lens PO) independently of one another, the Z stage 12B is adjusted for focusing deviation and deviation in inclination. The drive systems 34M, 34R, 34L are moved up and down in response to a command, which is indicative of an amount of drive, from a Z stage drive unit 122.

On the basis of measured coordinate values from the stage interferometer 121, the controller 123 outputs a prescribed drive command to the XY stage drive unit 120 and positions the XY stage 12XY (namely the wafer W) at any desired position in the XY coordinate system. At this time, acceleration sensors 113, 114 mounted on the projection lens PO measure acceleration of the projection lens PO along three axes thereof. The controller 123 calculates vibration of the projection lens PO and displacement of the imaging plane of the projection lens PO based upon the measured values from the acceleration sensors 113, 114.

The projection exposure apparatus is provided with an oblique-incidence focus inclination sensor in order to align the imaging plane of the projection lens PO and the surface of local shot areas of the wafer W. This sensor mainly includes a light source 104, a projection objective lens 105, a light-receiving objective lens 106 on which reflected light from the surface of wafer W impinges, and a light-receiving portion (CCD) 107. On the basis of the measured value from the oblique-incidence focus inclination sensor, the controller 123 calculates focusing deviation or deviation in inclination of the surface of the local shot areas of wafer W and outputs a prescribed command to the Z stage drive unit 122 in order to correct for such deviation. The controller 123 performs a correction based upon signals from the acceleration sensors 113, 114.

Note that, the projection lens PO corresponds to the projection optical system 1101 shown in FIG. 9, the acceleration sensors 113 and 114 correspond to the vibration measurement unit 1102, the oblique-incidence focus inclination sensor (104–107) corresponds to the surface position measurement unit 1103, the controller 123 corresponds to the control unit 1023, the XY stage drive unit 120 corresponds to the XY stage drive unit 1020, and the Z stage drive unit 122 corresponds to the Z stage drive unit 1022.

When XYZ-coordinate positioning from a certain shot area on the wafer W to another shot area thereof is carried out, the controller 123 drives the XY stage 12XY (namely the wafer W). Then, based upon the measured values from the acceleration sensors 113, 114 and measured values from the oblique-incidence focus inclination sensor (composed of the components 104, 105, 106 and 107), the controller 123 calculates displacement of the imaging plane of projection lens PO and focusing deviation and deviation in inclination of the surface of local shot areas of wafer W. The controller then drives the Z stage 12B and completes alignment in such a manner that the imaging plane after displacement obtained as a result of the foregoing and the local shot area surface of the wafer W will be made to coincide.

Figure 10:
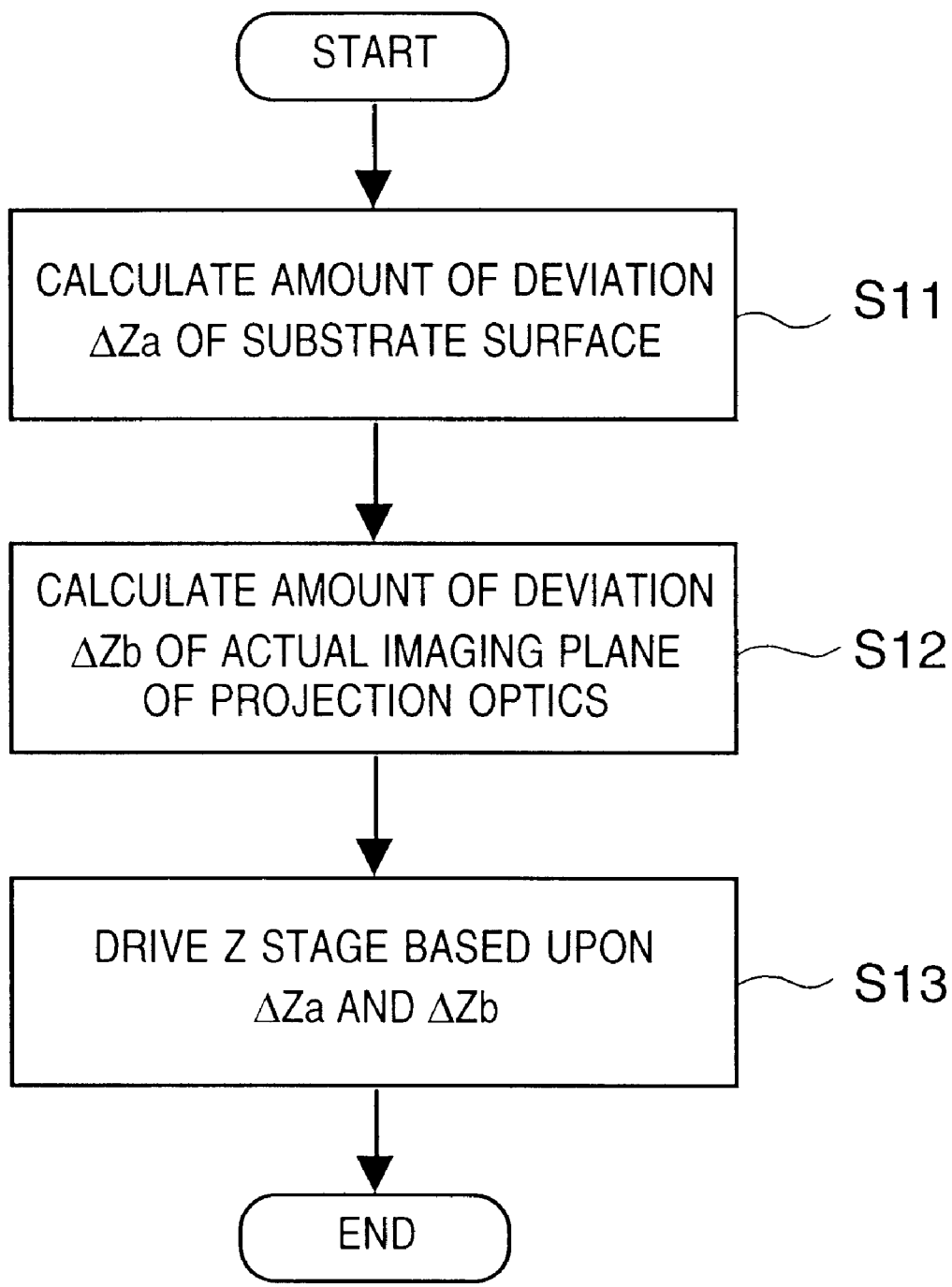
FIG. 10 is a flowchart useful in describing control for driving a Z table.

FIG. 10 is a flowchart useful in describing control for driving the Z table according to the embodiment set forth above. This processing is implemented by execution of a control program, which has been stored in the ROM, by the CPU of the controller 123. Further, FIG. 11 indicates position Za of the surface of the substrate on the Z stage, position Zb of the actual imaging plane of the projection optical system PO, and Zo position of the proper imaging plane defined logically.

As shown in FIG. 10, the position Za of the surface of the substrate on the stage along the Z axis is sensed by the oblique-incidence focus inclination sensor (104–107), which constitutes the surface position measurement unit 1103 shown in FIG. 9. Thus, the amount of deviation from the proper imaging plane position (Zo) is obtained and the amount of deviation is expressed by $\Delta Za$ at step S11. Next, at step S12, displacement of the lens barrel is sensed by the acceleration sensors 113 and 114 which constitute the vibration measurement unit 1102 shown in FIG. 9 and the actual position Zb of the imaging plane of the projection optical system PO is obtained. The amount of deviation of the actual position Zb of the imaging plane from the proper position Zo of the imaging plane is obtained, and the amount of deviation is expressed by $\Delta Zb$. This is followed by step S13, at which the amount by which the Z stage 12B is to be driven is obtained based upon $\Delta Za$ and $\Delta Zb$ and applied to the Z stage drive unit 122 in the form of a drive command.

If the direction upward from the reference plane Zo is taken as being the positive direction, for example, as shown in FIG. 11, then the amount of correction applied to the substrate surface by the Z stage can be obtained from $\Delta Zb - \Delta Za$.

It should be noted that in order to simplify the description, a case has been described in which the actual imaging plane is parallel to the proper imaging plane. However, it is also possible to deal with a case where the actual imaging plane is inclined with respect to the proper imaging plane. In such a case the inclination of the actual imaging plane would be obtained from the result of measurement by the vibration measurement unit 1102 and the Z stage would be driven accordingly. The details of such control would be obvious to one having ordinary skill in the art.

In the prior art, the position of the focus inclination sensor relative to the imaging plane of the projection optical system is considered to be fixed, the deviation of the imaging plane from the wafer surface is calculated from the value measured by the focus inclination sensor, and the XY stage 12XY and Z stage 12B are driven while measurement is performed successively by the stage interferometer 121 to bring the wafer surface and imaging plane into coincidence. In actuality, however, the imaging plane is displaced or deformed relative to the focus inclination sensor by vibration of the projection lens PO. Consequently, even if the stage is driven in accordance with the amount of correction calculated from the value measured by the focus inclination sensor, the displaced imaging plane cannot be brought into alignment with the wafer surface. This leads to deteriorated contrast, resolving power and alignment precision.

In this embodiment, therefore, the acceleration sensors 113, 114 are mounted on the projection lens, displacement of the imaging plane is obtained and the imaging plane after displacement and the wafer surface are aligned. As a result, the positional offset between the imaging plane and wafer surface is reduced and an improvement is achieved in contrast, resolving power and alignment precision.

Though displacement of the imaging plane of the projection lens is obtained using acceleration sensors in the foregoing embodiment, it is also possible to use a speedometer or displacement meter.

In regard to the number of acceleration sensors, the vibration of the rigid-body mode can be determined if two sensors are used, and secondary and tertiary deformation modes can be determined if three or four sensors are used.

Further, in accordance with the arrangement described above, it is also possible to ascertain displacement/distortion of the imaging plane of the projection lens on the reticle side as seen from the wafer stage. In the above embodiment, therefore, adjustment is performed by the Z stage 12B, drive systems 34M, 34R, 34L and XY stage 12XY on the wafer side. However, it is possible to provide a movable stage (e.g., an XYZ stage) on the side of the reticle 7 as well and perform an adjustment between the reticle surface and imaging plane.

[Embodiment of device production process]

Described next will be an embodiment of a process for producing a device utilizing the projection exposure apparatus or method set forth above.

Figure 6:
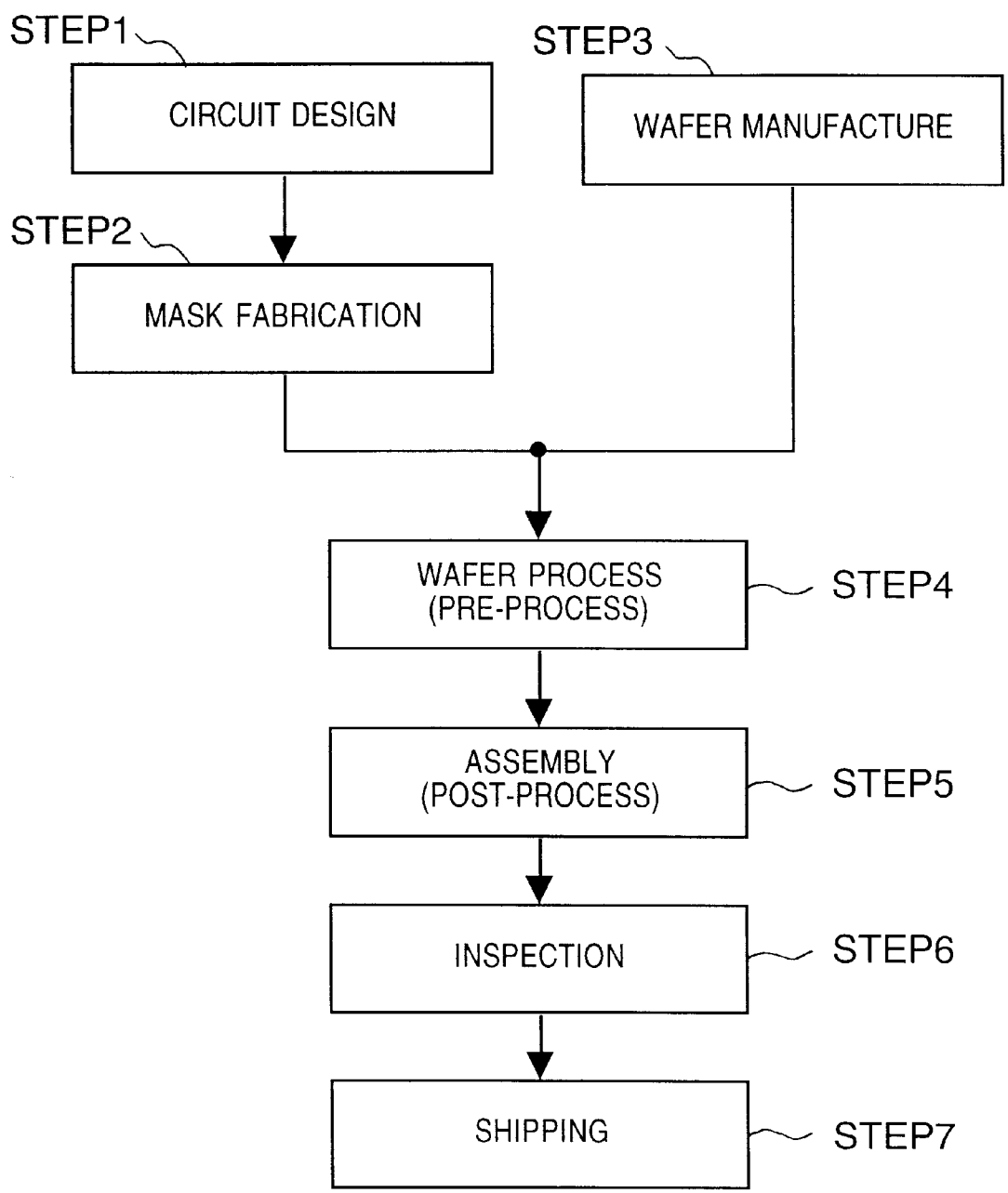
FIG. 6 is a diagram showing the flow of manufacturing a microdevice.

FIG. 6 illustrates the flow of manufacturing a microdevice (a semiconductor chip such as an IC or LSI chip, a liquid crystal panel, a CCD, a thin-film magnetic head, a micromachine, etc.). The pattern for the device is designed at step 1 (circuit design) A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as a "pre-process". A semiconductor chip is obtained, using the wafer fabricated at step 4, at step 5 (assembly), which is also referred to as a "post-process". This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7).

Figure 7:
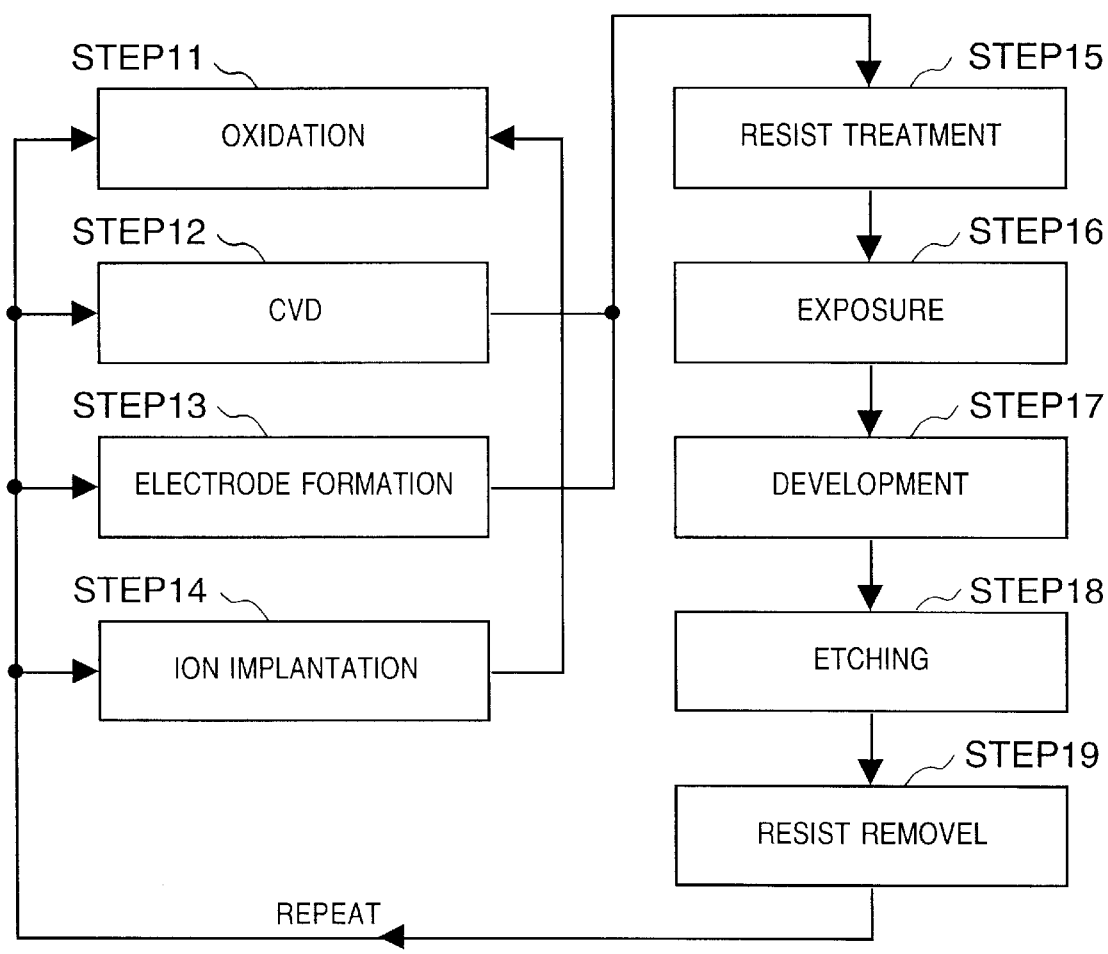
FIG. 7 is a diagram illustrating the detailed flow of a wafer process in FIG. 6.
Figure 8:
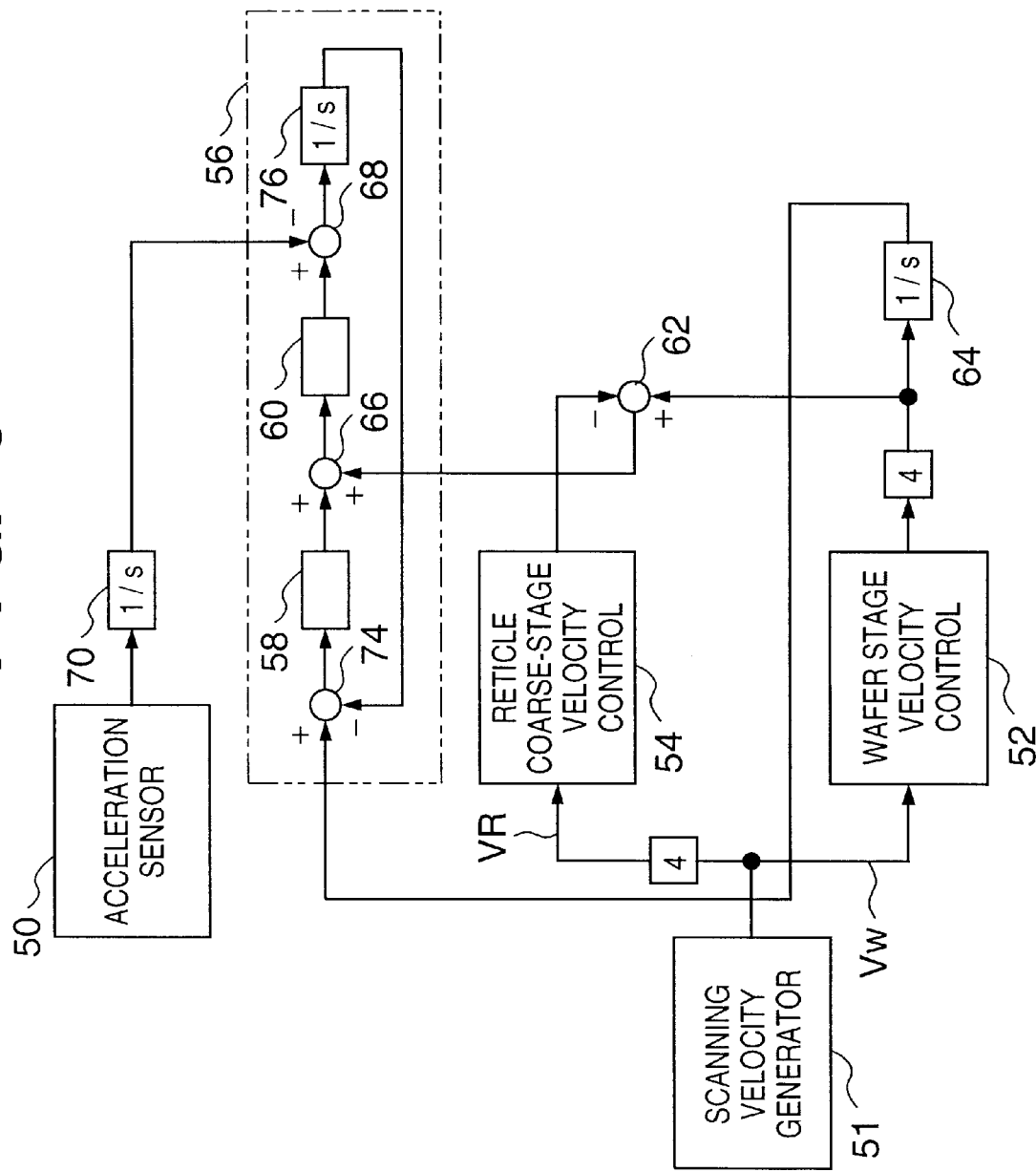
FIG. 8 is a block diagram showing a control arrangement illustrated in FIG. 2 of the specification of Japanese Patent Application Laid-Open (KOKAI) No. 10-261580.

FIG. 7 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described projection exposure apparatus at step 16 (exposure), and the exposed wafer is developed at step 17

(development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the production process of this embodiment is employed, semiconductor devices having a high degree of integration can be manufactured at low cost. Manufacture of such semiconductor devices using the prior-art techniques was difficult.

Thus, in accordance with the present invention as described above, a plurality of acceleration sensors are mounted on a projection optical system, whereby it becomes possible to calculate positional offset of the original plate and exposed substrate in a direction lying in a plane orthogonal to the optic axis of the projection optical system, or displacement or distortion of the imaging plane of the projection optical system. This makes it possible to prevent offset of the original plate and substrate to be exposed and to align the surface of the substrate with the imaging plane of the projection optical system in a highly precise manner. This in turn makes it possible to improve alignment precision, synchronizing precision, contrast and resolving power.

As many apparently widely different embodiments of the present invention can be made without departing from the spirit and scope thereof, it is to be understood that the invention is not limited to the specific embodiments thereof except as defined in the appended claims.

What is claimed is:

1. A projection exposure apparatus having projection optics for projecting a pattern, which has been formed on an original plate, onto a substrate to be exposed, said apparatus comprising:

at least two vibration measurement means for measuring vibration mode of the projection optics, the vibration mode including a flexural vibration mode of the projection optics;

an original plate stage on which the original plate is placed and which is movable in a plane orthogonal to an optical axis of the projection optics;

a substrate stage on which the substrate to be exposed is placed and which is movable in a plane orthogonal to the optical axis of the projection optics;

position measurement means for measuring positions of the original plate and substrate to be exposed; and control means for controlling the position of at least one of the original plate and substrate based upon a measured value from said position measurement means and vibration mode values derived from said at least two vibration measurement means.

2. The apparatus according to claim 1, wherein said vibration measurement means are disposed, in a spaced-apart relation, on the projection optics on the original plate side and on a substrate side thereof.

3. The apparatus according to claim 2, wherein said vibration measurement means are disposed at end portions, or in the vicinity thereof, of said projection optics on the original plate side and on a substrate side thereof.

4. The apparatus according to claim 1, wherein the apparatus is a step-and-repeat projection exposure apparatus and has said vibration measurement means in a number necessary to sense the flexural vibration mode of the projection optics, exposure being applied after sensing or judging that the flexural vibration mode has fallen within a predetermined tolerance.

5. The apparatus according to claim 1, wherein:

said substrate stage is movable along the direction of the optic axis of the projection optics and in a direction orthogonal to the direction of the optic axis;

said position measurement means measures the position of the substrate by measuring relative position of the surface of the substrate with respect to a predetermined position along the direction of the optic axis of the projection optics; and said control means moves a prescribed amount and positions the substrate along any direction orthogonal to the optic axis of the projection optics using the substrate stage, and moves and positions the substrate along the direction of the optic axis based upon measured values form said vibration measurement means and a measured value from said surface position measurement means, thereby aligning the surface of the substrate with the predetermined position.

6. The apparatus according to claim 5, wherein said control means senses the vibration mode of the projection optics based upon an output from each of said vibration measurement means.

7. The apparatus according to claim 5, wherein said vibration measurement means are mounted on a lens barrel of the projection optics.

8. The apparatus according to claim 7, wherein said control means calculates displacement of said predetermined position based upon vibration of the lens barrel using said vibration measurement means and aligns the surface of the substrate with said predetermined position after displacement.

9. The apparatus according to claim 5, further comprising means for driving the original plate, on which the pattern has been formed, based upon measured values from said vibration measurement means.

10. The apparatus according to claim 5, wherein the predetermined position is on an imaging plane of the projection optics or on a predetermined plane that is parallel to the imaging plane.

11. The apparatus according to claim 1, wherein said vibration measurement means is capable of measuring vibrations in one to three directions, namely along the direction of the optic axis of the projection optics and along two orthogonal axes lying in a plane that is orthogonal to the optic axis.

12. The apparatus according to claim 1, wherein said vibration measurement means is capable of measuring any one of acceleration and velocity of the projection optics.

13. The apparatus according to claim 12, wherein the measurement means capable of measuring acceleration of the projection optics is an acceleration sensor.

14. The apparatus according to claim 1, wherein said vibration measurement means use laser interferometers.

15. The apparatus according to claim 1, wherein the original plate on which the pattern has been formed is a mask substrate or a reticle substrate.

16. The apparatus according to claim 1, wherein the substrate to be exposed is any one of a photosensitive substrate, a substrate for measuring an amount of deviation of a photosensitive substrate along the optic axis of the projection optics, a substrate for measuring an amount of deviation of a photosensitive substrate in a direction orthogonal to the optic axis of said projection optics, and a substrate for measuring status of said projection exposure apparatus.

17. A projection exposure apparatus having projection optics for projecting a pattern, which has been formed on an original plate, onto a substrate to be exposed, said apparatus comprising:

at least two vibration measurement means for measuring vibration of the projection optics, wherein the apparatus is a scanning-type projection exposure apparatus and has said vibration measurement means in a number necessary to sense flexural vibration of the projection optics, an approach distance ahead of an acceleration/deceleration profile or constant-velocity scan being optimized in order to drive the original plate or substrate or both in such a manner that flexural vibration of the projection optics will fall within a predetermined tolerance when scanning exposure is performed.

18. A projection exposure apparatus having projection optics for projecting a pattern, which has been formed on an original plate, onto a substrate to be exposed, said apparatus comprising:

at least two vibration measurement means for measuring a vibration mode of the projection optics, wherein the apparatus is a step-and-repeat projection exposure apparatus and has said vibration measurement means in a number necessary to sense a flexural vibration mode of the projection optics, exposure being applied after sensing or judging that the flexural vibration mode has fallen within a predetermined tolerance, and parameters of a vibration-proof device supporting the projection optics are optimally selected so as to minimize the flexural vibration mode in the projection optics.

19. A projection exposure apparatus having projection optics for projecting a pattern, which has been formed on an original plate, onto a substrate to be exposed, said apparatus comprising:

at least two vibration measurement means for measuring a vibration mode of the projection optics;

a substrate stage on which the substrate to be exposed is placed and which is movable along the direction of the optic axis of the projection optics and in a direction orthogonal to the direction of the optic axis;

surface position measurement means for measuring relative position of the surface of the substrate with respect to a predetermined position along the direction of the optic axis of the projection optics; and control means for moving a prescribed amount and positioning the substrate along any direction orthogonal to the optic axis of the projection optics using the substrate stage, and moving and positioning the substrate along the direction of the optic axis based upon vibration mode values derived from said vibration measurement means and a measured value from said surface position measurement means, thereby aligning the surface of the substrate with the predetermined position, wherein said control means senses the vibration mode of the projection optics based upon an output from each of said vibration measurement means, and calculates at least one of a rigid-body mode and a deformation mode of the projection optics based upon measured values from said plurality of vibration measurement means.

20. A projection exposure apparatus having projection optics for projecting a pattern, which has been formed on an original plate, onto a substrate to be exposed, said apparatus comprising:

at least two vibration measurement means for measuring vibration of the projection optics, wherein said vibration measurement means are mounted on a lens barrel of the projection optics;

a substrate stage on which the substrate to be exposed is placed and which is movable along the direction of the optic axis of the projection optics and in a direction orthogonal to the direction of the optic axis;

surface position measurement means for measuring relative position of the surface of the substrate with respect to a predetermined position along the direction of the optic axis of the projection optics; and control means for moving a prescribed amount and positioning the substrate along any direction orthogonal to the optic axis of the projection optics using the substrate stage, and moving and positioning the substrate along the direction of the optic axis based upon measured values from said vibration measurement means and a measured value from said surface position measurement means, thereby aligning the surface of the substrate with the predetermined position, wherein said control means calculates an amount of distortion at the predetermined position from vibration of the lens barrel sensed using said vibration measurement means and corrects an amount of drive of said stage along the direction of the optic axis based upon the amount of distortion.

21. A projection exposure apparatus comprising:

projection optics for projecting a pattern, which has been formed on an original plate, onto a substrate;

a stage on which the substrate is placed and which is movable along the direction of an optic axis of said projection optics and in a direction orthogonal to the direction of the optic axis;

surface position measurement means for measuring a relative position of the surface of the substrate, which has been placed upon said stage, with respect to a predetermined position decided based upon the position of the projection optics;

vibration measurement means, which has a plurality of vibration sensors, for measuring a vibration mode of said projection optics, the vibration including flexural vibration of the vibration optics; and driving means for controlling drive of said stage based upon results of measurement by said surface position measurement means and said vibration measurement means.

22. The apparatus according to claim 21, wherein said vibration measurement means includes vibration sensors disposed, in a spaced-apart relation, on the projection optics on the original plate side and on a stage side thereof.

23. The apparatus according to claim 22, wherein said vibration measurement means includes vibration sensors disposed at end portions, or in the vicinity thereof, of said projection optics on the original plate side and on a stage side thereof.

24. The apparatus according to claim 21, wherein said driving means drives said stage to move the substrate, which has been placed on said stage, a predetermined amount in any direction orthogonal to the optic axis of said projection optics, thereby positioning said substrate along said direction, and moves said stage along the optic axis to position the substrate along the optic axis based upon a measured value from said vibration measurement means and a measured value from said surface position measurement means, whereby a prescribed surface of the substrate on said stage is aligned with a predetermined position relative to said projection optics.

25. The apparatus according to claim 21, wherein said vibration measurement means senses vibration of said projection optics based upon outputs from said plurality of vibration sensors.

26. The apparatus according to claim 21, wherein said vibration measurement means calculates at least one of a rigid-body mode and a deformation mode of said projection optics based upon signals from said plurality of vibration sensors.

27. The apparatus according to claim 21, further comprising original plate driving means for driving the original plate on which the pattern has been formed.

28. The apparatus according to claim 21, wherein said vibration measurement means measures vibration of said projection optics along the direction of the optic axis of said projection optics and along at least one of two orthogonal axial directions lying in a plane orthogonal to the optic axis.

29. The apparatus according to claim 21, wherein the vibration sensors provided on said vibration measurement means measure any one of acceleration, velocity and displacement of said projection optics.

30. The apparatus according to claim 21, wherein the vibration sensors of said vibration measurement means are acceleration sensors and/or velocity sensors.

31. The apparatus according to claim 21, wherein the vibration sensors of said vibration measurement means are mounted on a lens barrel possessed by said projection optics.

32. The apparatus according to claim 31, wherein said driving means calculates displacement of the predetermined position based upon vibration of the lens barrel sensed by said vibration measurement means and aligns the surface of the substrate on said stage with the predetermined position after displacement.

33. The apparatus according to claim 31, wherein said driving means calculates an amount of distortion at the predetermined position from vibration of the lens barrel sensed by said vibration measurement means and corrects an amount of drive of said stage along the direction of the optic axis based upon the amount of distortion.

34. The apparatus according to claim 21, wherein the original plate on which the pattern has been formed is a mask substrate or a reticle substrate.

35. The apparatus according to claim 21, wherein the substrate is any one of a photosensitive substrate, a substrate for measuring an amount of deviation of a photosensitive substrate along the optic axis of said projection optics, a substrate for measuring an amount of deviation of a photosensitive substrate in a direction orthogonal to the optic axis of said projection optics, and a substrate for measuring status of said projection exposure apparatus.

36. The apparatus according to claim 21, wherein the predetermined position is on an imaging plane of said projection optics.

37. The apparatus according to claim 21, wherein the predetermined position is on a predetermined plane that is parallel to an imaging plane of said projection optics.

38. A method of controlling a projection exposure apparatus having projection optics for projecting a pattern, which has been formed on an original plate, onto a substrate, and a stage on which the substrate is placed and which is movable along the direction of an optic axis of said projection optics and in a direction orthogonal to the direction of the optic axis, said method comprising:
a surface position measurement step of measuring a relative position of the surface of the substrate, which has been placed upon the stage, with respect to a predetermined position decided based upon the position of the projection optics;
a vibration measurement step of measuring vibration of the projection optics by a plurality of vibration sensors, the vibration including flexural vibration of the vibration optics; and
a driving step of controlling drive of the stage based upon results of measurement at said surface position measurement step and said vibration measurement step.

39. The method according to claim 38, wherein said driving step further comprises driving the stage to move the substrate, which has been placed on the stage, a predetermined amount in any direction orthogonal to the optic axis of the projection optics, thereby positioning the substrate along the direction, and moving the stage along the optic axis to position the substrate along the optic axis based upon a measured value obtained at said vibration measurement step and a measured value obtained at said surface position measurement step, whereby a prescribed surface of the substrate on the stage is aligned with a predetermined position relative to the projection optics.

40. The method according to claim 38, wherein said vibration measurement step senses vibration of the projection optics based upon outputs from the plurality of vibration sensors.

41. The method according to claim 38, wherein said vibration measurement step calculates at least one of a rigid-body mode and a deformation mode of the projection optics based upon signals from the plurality of vibration sensors.

42. The method according to claim 38, further comprising an original plate driving step of driving the original plate on which the pattern has been formed.

43. The method according to claim 38, wherein said vibration measurement step measures vibration of the projection optics along the direction of the optic axis of the projection optics and along at least one of two orthogonal axial directions lying in a plane orthogonal to the optic axis.

44. The method according to claim 38, wherein said vibration measurement step measures any one of acceleration, velocity and displacement of the projection optics.

45. The method according to claim 38, wherein:
said vibration measurement step measures vibration of a lens tube possessed by the projection optics; and
said driving step calculates displacement of the predetermined position based upon vibration of the lens barrel measured at said vibration measurement step and aligns the surface of the substrate on the stage with the predetermined position after displacement.

46. The method according to claim 38, wherein:
said vibration measurement step measures vibration of a lens tube possessed by the projection optics; and
said driving step calculates an amount of distortion at the predetermined position from vibration of the lens barrel sensed at said vibration measurement step and corrects an amount of drive of the stage along the direction of the optic axis based upon the amount of distortion.

47. The method according to claim 38, wherein the original plate on which the pattern has been formed is a mask substrate or a reticle substrate.

48. The method according to claim 38, wherein the substrate is any one of a photosensitive substrate, a substrate for measuring an amount of deviation of a photosensitive substrate along the optic axis of the projection optics, a substrate for measuring an amount of deviation of a photosensitive substrate in a direction orthogonal to the optic axis of said projection optics, and a substrate for measuring status of the projection exposure apparatus.

49. The method according to claim 38, wherein the predetermined position is on an imaging plane of the projection optics.

50. The method according to claim 38, wherein the predetermined position is on a predetermined plane that is parallel to an imaging plane of the projection optics.

51. A method of manufacturing a device using a projection exposure apparatus having projection optics for projecting a pattern, which has been formed on an original plate, onto a substrate, and a stage on which the substrate is placed and which is movable along the direction of an optic axis of the projection optics and in a direction orthogonal to the direction of the optic axis, said method comprising:

a supply step of placing the substrate on the stage;

a surface position measurement step of measuring a relative position of the surface of the substrate, which has been placed upon the stage, with respect to a predetermined position decided based upon the position of the projection optics;

a vibration measurement step of measuring vibration of the projection optics by a plurality of vibration sensors, the vibration including flexural vibration of the vibration optics; and a driving step of controlling drive of the stage based upon results of measurement at said surface position measurement step and said vibration measurement step.

52. A method of manufacturing a device using a projection exposure apparatus comprising projection optics for projecting a pattern, which has been formed on an original plate, onto a substrate to be exposed, an original plate stage on which the original plate is placed and which is movable in a plane orthogonal to the optical axis of the projection optics, a substrate stage on which the substrate to be exposed is placed and which is movable in a plane orthogonal to the optical axis of the projection optics, and position measurement means for measuring positions of the original plate and substrate to be exposed, said method comprising the steps of:

supplying a substrate to be exposed to the projection exposure apparatus;

measuring, using at least two vibration measurement means, a vibration mode of the projection optics, the vibration mode including a flexural mode of the projection optics;

controlling the position of at least one of the original plate and substrate based upon measured values derived from the position measurement means and a vibration mode value from the at least two vibration measurement means; and projecting the pattern onto the substrate to manufacture a device.

53. A projection exposure apparatus comprising:

projection optics for projecting a pattern, which has been formed on an original plate, onto a substrate;

a stage on which the substrate is placed and which is movable along the direction of an optical axis of said projection optics;

vibration measurement means, which has a plurality of vibration sensors, for measuring vibration of said projection optics, the vibration including flexural vibration of said vibration optics; and driving means for controlling drive of said stage, along the direction of the optical axis of said projection optics, based upon results of measurement by said vibration measurement means.

54. A method of controlling a projection exposure apparatus, which has projection optics for projecting a pattern, which has been formed on an original plate, onto a substrate, and a stage on which the substrate is placed and which is movable along the direction of an optical axis of said projection optics, said method comprising:

the vibration measurement step of measuring vibration of the projection optics by using a plurality of vibration sensors, for measuring vibration of said projection optics, the vibration including flexural vibration of said vibration optics; and the driving step of controlling drive of the stage, along the direction of the optical axis of the projection optics, based upon results of measurement in the vibration measurement step.

* * * * *

UNITED STATES PATENT AND TRADEMARK OFFICE
CERTIFICATE OF CORRECTION

PATENT NO. : 6,359,688 B2
DATED : March 19, 2002
INVENTOR(S) : Satoshi Akimoto et al.

It is certified that error appears in the above-identified patent and that said Letters Patent is hereby corrected as shown below:

Column 3,
Line 34, "for" should be deleted.

Column 7,
Line 55, "for" should be deleted.

Column 11,
Line 49, "Anon-interfering" should read -- A non-interfering --.

Column 13,
Line 53, "$\Delta\tau\varepsilon + \Delta\tau\varepsilon.$" should read -- $\Delta\tau\varepsilon + \Delta\tau\theta.$ --.

Column 15,
Line 17, "In such, case," should read -- In such a case, --.

Column 16,
Line 17, "fabricating semi-" should read -- fabricating a semi- --.
Line 18, "a" should be deleted.

Column 17,
Line 54, "a case" should read -- a case, --.

Column 18,
Line 41, "(circuit design)" should read -- (circuit design). --.

Column 20,
Line 14, "form" should read -- from --.

UNITED STATES PATENT AND TRADEMARK OFFICE
CERTIFICATE OF CORRECTION

PATENT NO. : 6,359,688 B2
DATED : March 19, 2002
INVENTOR(S) : Satoshi Akimoto et al.

It is certified that error appears in the above-identified patent and that said Letters Patent is hereby corrected as shown below:

<u>Column 26,</u>
Line 17, "and driving" should read -- and ¶driving --.

Signed and Sealed this

Second Day of July, 2002

Attest:

JAMES E. ROGAN
*Attesting Officer*     *Director of the United States Patent and Trademark Office*